United States Patent
Lee et al.

(10) Patent No.: US 11,673,829 B2
(45) Date of Patent: Jun. 13, 2023

(54) WINDOW PANEL, ELECTRONIC APPARATUS INCLUDING SAME, AND METHOD FOR MANUFACTURING WINDOW PANEL

(71) Applicant: Samsung Display Co., Ltd., Yongin-si (KR)

(72) Inventors: Hoikwan Lee, Suwon-si (KR); Seung Kim, Seongnam-si (KR); Seungho Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 170 days.

(21) Appl. No.: 16/729,783

(22) Filed: Dec. 30, 2019

(65) Prior Publication Data
US 2020/0207659 A1    Jul. 2, 2020

(30) Foreign Application Priority Data
Dec. 28, 2018    (KR) ........................ 10-2018-0172434

(51) Int. Cl.
| | | |
|---|---|---|
| C03C 21/00 | (2006.01) | |
| H05K 5/00 | (2006.01) | |
| H05K 5/03 | (2006.01) | |
| H10K 102/00 | (2023.01) | |
| H05K 5/02 | (2006.01) | |

(Continued)

(52) U.S. Cl.
CPC ......... *C03C 21/002* (2013.01); *H05K 5/0017* (2013.01); *H05K 5/03* (2013.01); *H01L 51/524* (2013.01); *H01L 2251/5338* (2013.01); *H05K 5/0226* (2013.01)

(58) Field of Classification Search
CPC ...... C03C 21/002; C03C 4/18; H05K 5/0017; H05K 5/03; H05K 5/0226; H01L 51/524; H01L 2251/5338; H01L 27/3244; H01L 51/0097; G09F 9/301; Y02P 40/57
See application file for complete search history.

(56) References Cited

U.S. PATENT DOCUMENTS

| | | |
|---|---|---|
| 8,312,739 B2 | 11/2012 | Lee et al. |
| 9,557,773 B2 | 1/2017 | Chang et al. |
| 9,593,042 B2 | 3/2017 | Hu et al. |

(Continued)

FOREIGN PATENT DOCUMENTS

| | | |
|---|---|---|
| CN | 102137822 A | 7/2011 |
| CN | 105593185 A | 5/2016 |

(Continued)

OTHER PUBLICATIONS

Chinese Office Action for CN Application No. 201911393469.5 dated Sep. 1, 2022, 9 pages.

*Primary Examiner* — Nathan L Van Sell
(74) *Attorney, Agent, or Firm* — Lewis Roca Rothgerber Christie LLP

(57) ABSTRACT

A window panel includes: a substrate having a thickness of less than 100 μm and including a first surface and a second surface facing each other in a thickness direction; first ions dispersed in the substrate and each having a first ion radius; and second ions dispersed in the substrate and each having a second ion radius which is greater than the first ion radius, wherein the second ions generate a compressive stress, the compressive stress is reduced with depth from the first surface or the second surface within a range from the first surface or the second surface to a ½ point of the thickness.

19 Claims, 23 Drawing Sheets

(51) Int. Cl.
    *H10K 50/84*     (2023.01)
    *H01L 51/52*     (2006.01)

(56) References Cited

U.S. PATENT DOCUMENTS

| | | |
|---|---|---|
| 9,801,297 B2 | 10/2017 | Amin et al. |
| 9,898,046 B2 | 2/2018 | Chang et al. |
| 10,150,698 B2 | 12/2018 | Amin et al. |
| 10,986,744 B2 | 4/2021 | Yeum et al. |
| 2015/0239775 A1 | 8/2015 | Amin et al. |
| 2016/0214889 A1 | 7/2016 | Garner et al. |
| 2017/0226007 A1 | 8/2017 | Garner et al. |

FOREIGN PATENT DOCUMENTS

| | | |
|---|---|---|
| CN | 108074489 A | 5/2018 |
| CN | 108290770 A | 7/2018 |
| CN | 108779025 A | 11/2018 |
| KR | 10-2016-0071427 A | 6/2016 |
| KR | 10-2017-0066605 A | 6/2017 |
| KR | 10-2017-0068473 A | 6/2017 |
| KR | 10-2018-0131319 A | 12/2018 |

CS_13

CS_23

WINDOW PANEL, ELECTRONIC APPARATUS INCLUDING SAME, AND METHOD FOR MANUFACTURING WINDOW PANEL

CROSS-REFERENCE TO RELATED APPLICATION

This application claims priority to and the benefit of Korean Patent Application No. 10-2018-0172130, filed on Dec. 28, 2018, the entire contents of which are hereby incorporated by reference.

BACKGROUND

Aspects of some example embodiments of the present disclosure herein relate to a window panel, an electronic apparatus including the same, a method for manufacturing a window panel, and for example, to a strengthened window panel, an electronic apparatus including the same, and a method for manufacturing a window panel.

An electronic apparatus may include a window member, a receiving member, and an electronic element. The electronic element may include various elements which are activated in response to an electrical signal, such as a display element, a touch element, or a detection element.

The window member protects the electronic element and provides an active region to a user. Accordingly, the user may provide an input to the electronic element through the window member, or receive information generated in the electronic element. Also, the electronic element may be stably protected by the window member from external impact.

A window member may be lightweight and thin, and in order to compensate for the structural vulnerability thereof, various methods for reinforcing the window member may be utilized.

The above information disclosed in this Background section is only for enhancement of understanding of the background and therefore it may contain information that does not constitute prior art.

SUMMARY

Some example embodiments of the present disclosure may include a window panel with improved durability.

Some example embodiments of the present disclosure may also include a method for manufacturing the window panel.

Some example embodiments of the inventive concept may include a window panel including a substrate having a thickness of less than 100 μm and having a first surface and a second surface facing each other in a thickness direction, first ions dispersed in the substrate and each having a first ion radius, and second ions dispersed in the substrate and each having a second ion radius which is greater than the first ion radius, wherein the second ions generate a predetermined compressive stress, the compressive stress is reduced with depth from the first surface or the second surface within a range from the first surface or the second surface to a ½ point of the thickness, and the depth of compression is defined as a depth at which the compressive stress becomes 0 (zero), wherein the depth of compression satisfies the following:

$$0.15T \leq DOC \leq 0.3T,$$

wherein T is a thickness of the substrate, and DOC is the depth of compression.

According to some example embodiments, the compressive stress may be reduced in a depth range not less than the depth of compression.

According to some example embodiments, a depth of layer which is defined as the maximum penetration depth penetrable by the second ions from the first surface or the second surface may be designed to be 0.5 T or greater.

According to some example embodiments, surface compressive stress may be 200 MPa or greater.

According to some example embodiments, a depth of layer which is defined as the maximum depth in which the second ions are spaced from the first surface or the second surface may be 0.3 T or greater, and the surface compressive stress may be 100 MPa or greater.

According to some example embodiments, surface compressive stress at each of the first surface and the second surface may be 500 MPa or greater.

According to some example embodiments, an initial transition point at which the slope of the compressive stress changes while the compressive stress is reduced may be 0.2 T or less.

According to some example embodiments, the second ions may contain alkali metal ions.

According to some example embodiments, the substrate may be foldable about a folding axis extended along a direction intersecting the thickness direction.

According to some example embodiments of the inventive concept, an electronic apparatus includes a display panel configured to display an image on a front surface thereof, and a window panel on the front surface of the display panel and including a first surface and a second surface which is opposite to the first surface and faces the display panel, wherein the window panel and the display panel are foldable about a folding axis extend along a direction intersecting a thickness direction, internal stress of the window panel has a stress behavior which varies according to depth from each of the first surface and the second surface to a ½ point of the thickness of the window panel, the stress behavior includes surface compressive stress, depth of compression, depth of layer, and center tensile stress, and the depth of compression satisfies:

$$0.15T \leq DOC \leq 0.3T,$$

wherein T is the thickness of the window panel, and DOC is the depth of compression.

According to some example embodiments, the stress behavior may change in a depth range not less than the depth of compression.

According to some example embodiments, the depth of layer may be about 0.3 T or greater.

According to some example embodiments, the surface compressive stress may be about 500 MPa or greater.

According to some example embodiments, an initial transition point at which the slope of the stress behavior changes may be 0.2 T or less.

According to some example embodiments of the inventive concept, a method for manufacturing a window panel includes providing an initial window panel including a first ion, and reinforcing the initial window panel by impregnating the initial window panel with a metal salt including a second ion having a greater radius than the first ion such that a window panel is formed, wherein the thickness of the window panel is less than 100 μm, and a depth of compression of the window panel satisfies:

$$0.15T \leq DOC \leq 0.3T,$$

wherein T is the thickness of a window panel, and DOC is the depth of compression.

According to some example embodiments, the metal salt may comprise a single salt and the metal salt may comprise an alkali nitrate salt, and in the reinforcing the initial window panel, the depth of layer of the second ion may be designed to be 0.5 T or greater.

According to some example embodiments, the metal salt may comprise a mixed salt and the metal salt may comprise at least two different alkali nitrate salts, and in the reinforcing the initial window panel, the depth of layer of the second ion may be designed to be 0.5 T or greater.

According to some example embodiments, the reinforcing the initial window panel may comprise a first reinforcing step immersing the initial window panel in a mixed salt, and a second reinforcing step immersing the initial window panel which has been subjected to the first reinforcing step in a single salt, wherein the depth of compression of the window panel may be less than 0.2 T.

According to some example embodiments, in the first reinforcing step, the depth of layer of the second ion may be designed to be 0.3 T or greater.

According to some example embodiments, the surface compressive stress of the window panel may be 500 MPa or greater.

BRIEF DESCRIPTION OF THE FIGURES

The accompanying drawings are included to provide a further understanding of the inventive concept, and are incorporated in and constitute a part of this specification. The drawings illustrate aspects embodiments of the inventive concept and, together with the description, serve to explain principles of the inventive concept.

In the drawings.

DETAILED DESCRIPTION

Figure 1:
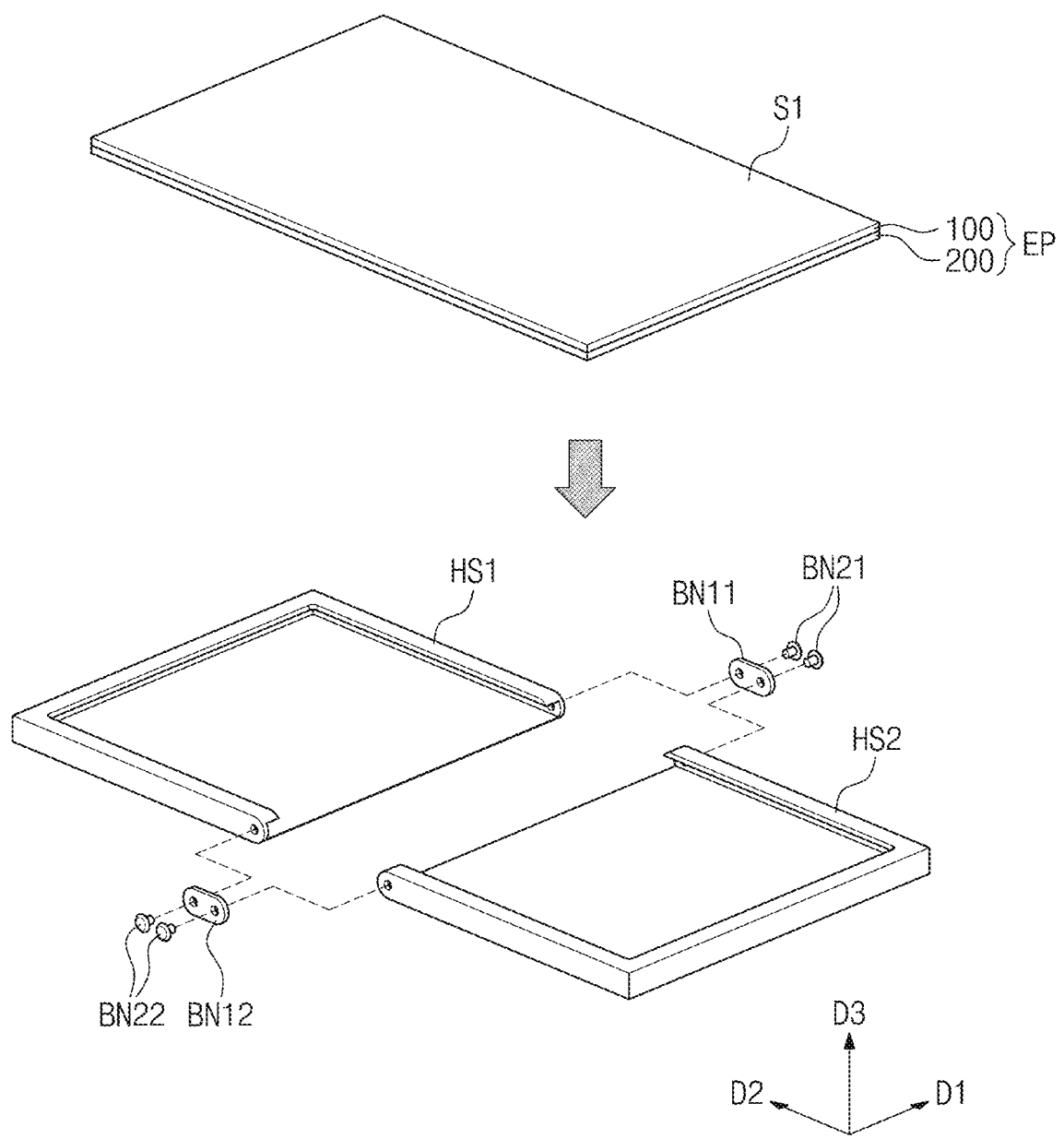
FIG. 1 is an exploded perspective view of an electronic apparatus according to some example embodiments of the inventive concept.

In the present disclosure, when an element (or a region, a layer, a portion, etc.) is referred to as being "on," "connected to," or "coupled to" another element, it means that the element may be directly located on/connected to/coupled to the other element, or that a third element may be located therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, aspects of some example embodiments of the inventive concept will be described with reference to the accompanying drawings.

Figure 2A:
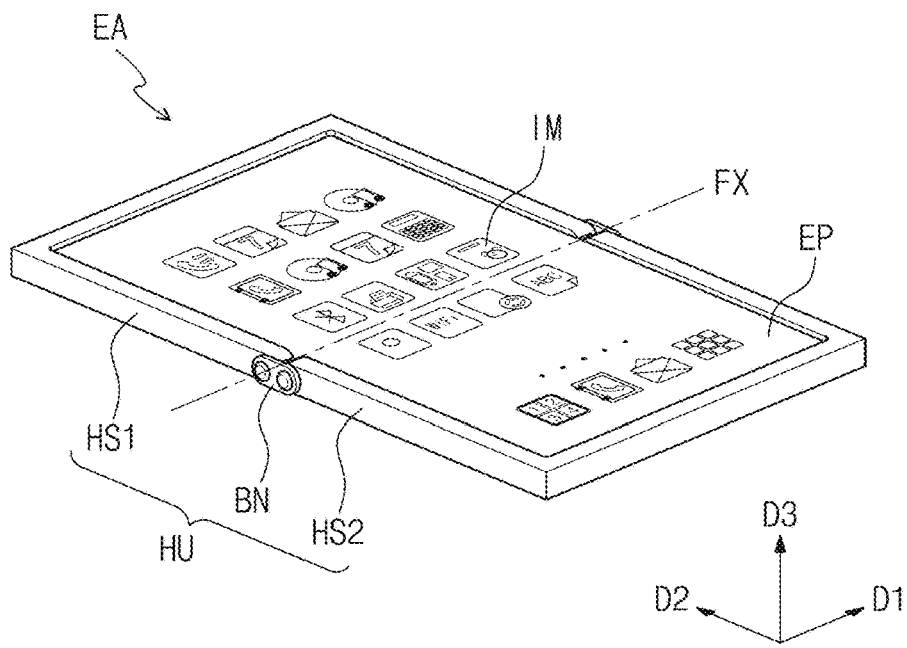
FIG. 2A and FIG. 2B are assembled perspective views of an electronic apparatus according to some example embodiments of the inventive concept.
Figure 2B:
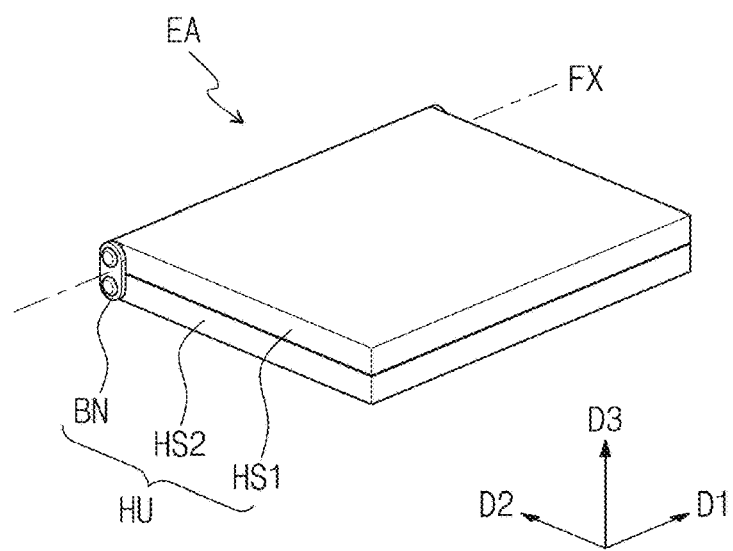
Figure 3A:
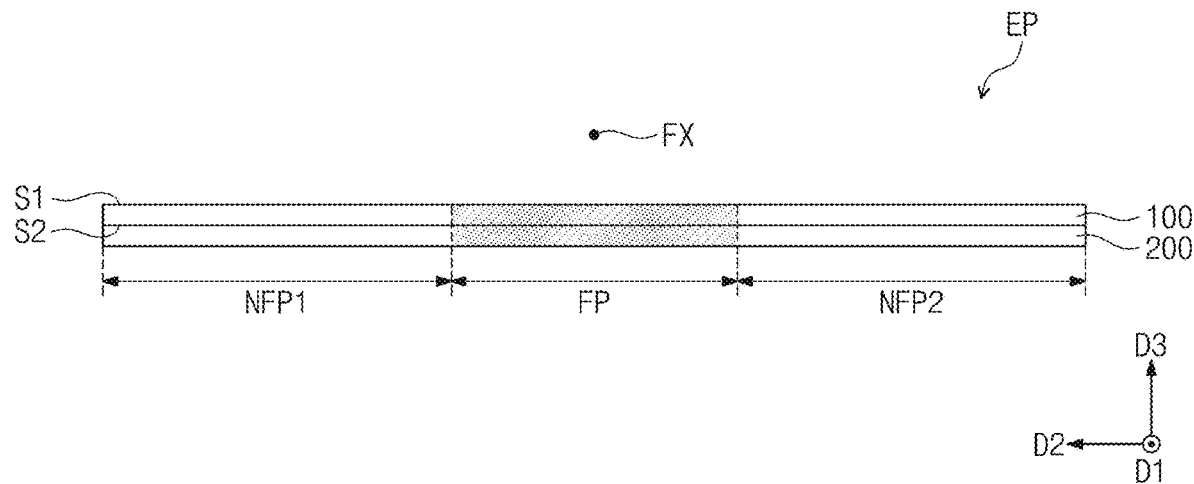
FIG. 3A and FIG. 3B are cross-sectional views of an electronic panel illustrated in FIG. 1.
Figure 3B:
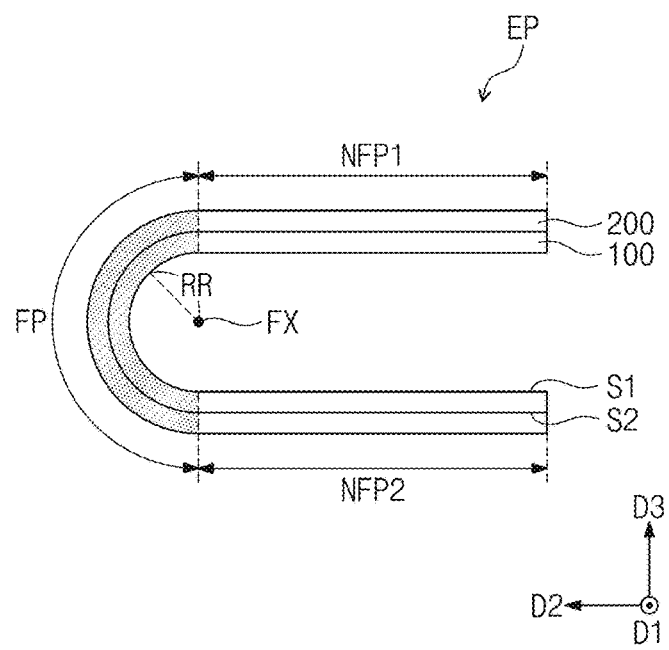

FIG. 1 is an exploded perspective view of an electronic apparatus according to some example embodiments of the inventive concept. FIG. 2A and FIG. 2B are assembled perspective views of an electronic apparatus according to some example embodiments of the inventive concept. FIG. 3A and FIG. 3B are cross-sectional views of an electronic panel illustrated in FIG. 1. FIG. 2A and FIG. 2B shows an electronic apparatus in various states for ease of description. Hereinafter, an electronic apparatus will be described with reference to FIG. 1 to FIG. 2B.

An electronic apparatus EA includes an electronic panel EP and a housing unit HU. The electronic panel EP may have flexibility. The electronic panel EP may be folded or unfolded about a folding axis FX extended along one direction. In the present embodiment, the folding axis FX is illustrated as being extended along a first direction D1 and defined on a front surface of the electronic panel EP. However, this is only an example. Depending on a design, the folding axis FX may be defined on a back surface of the electronic panel EP or may be extended along a second direction D2 or a direction intersecting the first direction D1 and the second direction D2, but is not limited to any one embodiment.

The electronic panel EP may be activated by an electrical signal. According to some example embodiments, the electronic panel EP is activated to display an image IM on the front surface thereof. A user may receive information through the image IM. However, this is only an example. The electronic panel EP may be activated to sense an external input applied to the front surface. The external input may include a user's touch, a contact or adjacency by an inanimate object, pressure, light, or heat, but is not limited to any one embodiment.

The electronic panel EP may include a window panel 100 and a display panel 200. The window panel 100 includes a first surface S1 and a second surface S2 opposite to each other in a third direction D3 on a plane defined by a first direction D1 and a second direction D2. The first surface S1 may be a front surface of the window panel 100, and defines the front surface of the electronic panel EP. The second surface S2 may be a back surface of the window panel 100. The second surface S2 may be a surface facing the display panel 200. In the assembled perspective view of the electronic apparatus EA illustrated in FIG. 1, the second surface S2 is not exposed to the outside.

The window panel 100 may have a thickness defined in the third direction D3. The thickness of the window panel 100 may correspond to a distance between the first surface S1 and the second surface S2.

According to some example embodiments, the window panel 100 may be in a thin shape. For example, the thickness of the window panel 100 may be about 100 μm or less. Also, the window panel 100 may be optically transparent, and may have a predetermined rigidity. For example, the window panel 100 may be a thin film substrate of a glass material.

The window panel 100 according to some example embodiments of the inventive concept may have stable reliability against external impact even with a thickness of 100 μm or less. A more detailed description thereof will be described later.

The electronic apparatus EA according to some example embodiments of the inventive concept may be made to be slim and lightweight, and have suitable flexibility for a folding operation by including the window panel 100 in a thin shape. Also, the window panel 100 has a small thickness while including glass which is a relatively rigid material, and thus may easily implement the electronic apparatus EA which is slim and has improved reliability.

The display panel 200 is located on the second surface S2 of the window panel 100. According to some example embodiments, an adhesive layer (e.g., a predetermined adhesive layer, or an adhesive layer having a predetermined thickness or predetermined properties) may be further located between the display panel 200 and the window panel 100. The image IM may be displayed substantially by the display panel 200. The image IM displayed on the display panel 200 may transmit the window panel 100 to be easily viewed by a user outside.

FIG. 3A and FIG. 3B schematically illustrate a cross-sectional view of the electronic panel EP according to an operation. FIG. 3A illustrates the electronic panel EP corresponding to FIG. 2A and in an unfolded state, and FIG. 3B illustrates the electronic panel EP corresponding to FIG. 2B and in a folded state. Hereinafter, aspects of some example embodiments of the inventive concept will be described with reference to FIG. 3A and FIG. 3B.

The electronic panel EP according to some example embodiments of the inventive concept may be folded about the folding axis FX. The electronic panel EP includes a folding portion FP, a first plane portion NFP1 and a second plane portion NFP2. The first plane portion NFP1 and the second plane portion NFP2 may be arranged in the second direction D2, and the folding portion FP may be located between the first plane portion NFP1 and the second plane portion NFP2. The first plane portion NFP1 and the second plane portion NFP2 may be connected to have an integral shape. According to some example embodiments, the folding portion FP is illustrated shaded for ease of explanation.

The folding portion FP may be folded about the folding axis FX. The folding portion FP may be a portion the shape of which is deformed when the electronic panel EP is folded. The folding portion FP may be folded about the folding axis FX in a first mode and have a semi-circular shape with a predetermined radius RR on a cross-section defined by the second direction D2 and the third direction D3. The radius RR illustrated in FIG. 3B refers to an inner radius, and may be defined as a distance from the first surface S1 of the window panel 100 to the folding axis FX. According to some example embodiments, the folding portion FP may be applied with folding stress according to folding.

The first plane portion NFP1 is adjacent to one side of the folding portion FP and the second plane portion NFP2 is adjacent to the other side of the folding portion FP. The first plane portion NFP1 and the second plane portion NFP2 may be spaced apart from each other in the second direction D2 having the folding portion FP interposed therebetween. The first plane portion NFP1 and the second plane portion NFP2 may be portions the shape of which are not deformed when the electronic panel EP is folded.

According to some example embodiments of the inventive concept, the electronic panel EP may have flexibility. Accordingly, the electronic panel EP may be folded and unfolded about the folding axis FX to be deformed into various shapes.

Referring back to FIG. 1 to FIG. 2B, the housing unit HU receives the electronic panel EP, and defines an appearance of the electronic apparatus EA. The housing unit HU may deform its own shape. A shape of the electronic panel EP may be determined by a shape of the housing unit HU. For example, the housing unit HU may include a first housing member HS1, a second housing member HS2, and a coupling member BN.

The first housing member HS1 receives a portion of the electronic panel EP. A portion of the electronic panel EP may be inserted into the first housing member HS1. The second housing member HS2 may be arranged such that it is spaced apart from the first housing member HS1 in the second direction D2. The second housing member HS2 receives another portion of the electronic panel EP. Another portion of the electronic panel EP may be inserted into the second housing member HS2.

The coupling member BN is located between the first and second housing members HS1 and HS2 and couples the first and second housing members HS1 and HS2. Meanwhile, the first and second housing members HS1 and HS2 may move while being connected to the coupling member BN. According to the movement of the first and second housing members HS1 and HS2, the folding or unfolding state of the electronic panel EP may be determined.

The coupling member BN includes first coupling parts BN11 and BN12, and second coupling parts BN21 and BN22. The first coupling parts BN11 and BN12 are arranged to be spaced apart from each other in the first direction D1 having the first and second housing members HS1 and HS2 interposed therebetween. The first coupling parts BN11 and BN12 each couple one sides of the first and second housing members HS1 and HS2 to the other sides thereof, respectively.

According to some example embodiments, each of the first coupling parts BN11 and BN12 may be a plate having two holes defined thereon, and each of the second coupling parts BN21 and BN22 may be a bolt. The second coupling parts BN21 and BN22 may be coupled to the first and second housing members HS1 and HS2 through the holes defined on the first coupling parts BN11 and BN12, respectively. However, this is only an example and embodiments are not limited thereto. The first coupling parts BN11 and BN12 and the second coupling parts BN21 and BN22 may be designed in various configurations which allow the first and second housing members HS1 and HS2 to be folded or unfolded about the folding axis FX, but are not limited to any one embodiment.

FIG. 2A illustrates the electronic apparatus EA in an unfolded state. As illustrated in FIG. 2A, in the unfolded state, the electronic apparatus EA exposes the front surface of the electronic panel EP to the outside. The user may easily view the image IM provided to the electronic panel EP.

FIG. 2B illustrates the electronic apparatus EA in a folded state. As illustrated in FIG. 2B, in the folded state, the electronic panel EP is covered by the housing unit HU, and thus is not viewed from the outside.

The electronic apparatus EA according to some example embodiments of the inventive concept includes the electronic panel EP which is flexible and the housing unit HU which is deformable, and thus may fold and unfold the electronic panel EP. Accordingly, the portability of the electronic apparatus EA is improved and the utilizability of the electronic apparatus EA in various environments may be improved.

Figure 4A:
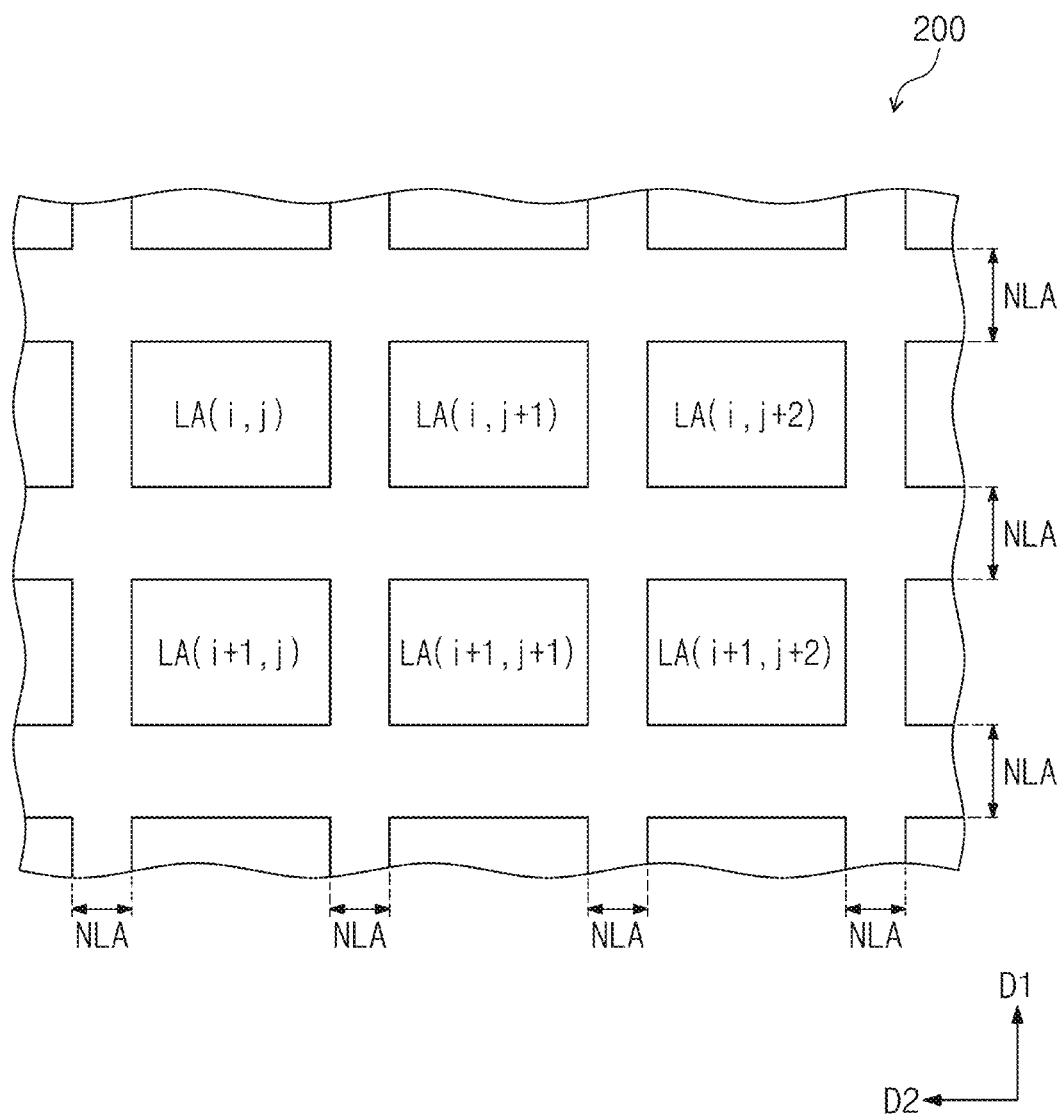
FIG. 4A is a plan view schematically illustrating a portion of the electronic panel of FIG. 3A.
Figure 4B:
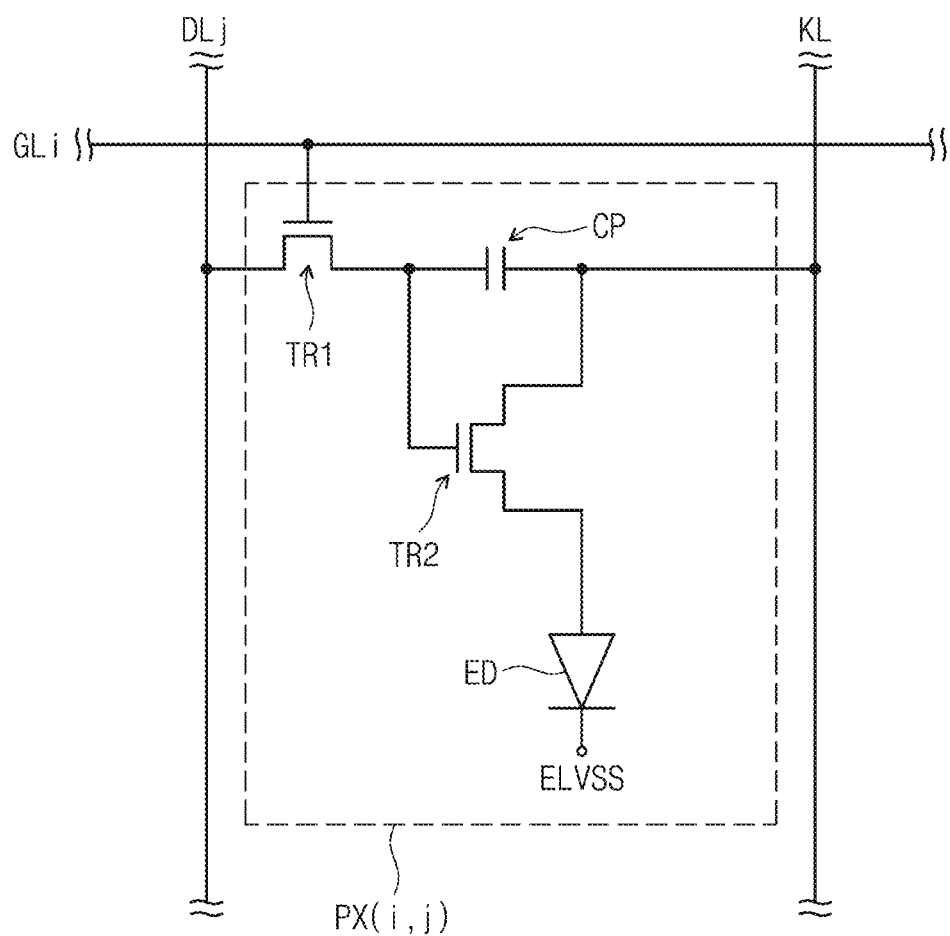
FIG. 4B is a signal circuit diagram illustrating a portion of the configuration of an electronic panel according to some example embodiments of the inventive concept.
Figure 4C:
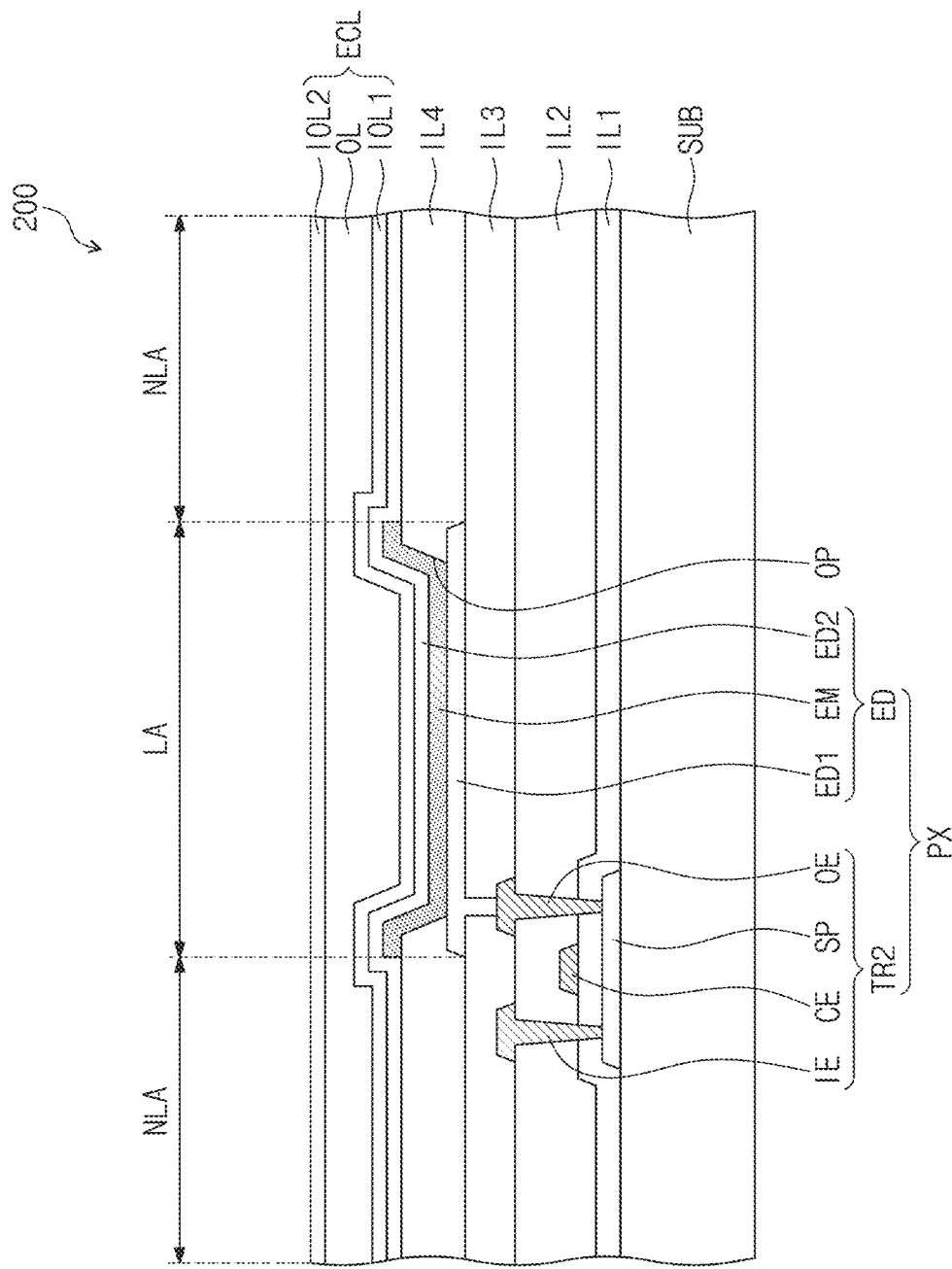
FIG. 4C is a cross-sectional view schematically illustrating a portion of FIG. 4A.

FIG. 4A is a plan view schematically illustrating a portion of the electronic panel of FIG. 3A, and FIG. 4B is a signal circuit diagram illustrating a portion of the configuration of an electronic panel according to some example embodiments of the inventive concept. FIG. 4C is a cross-sectional view schematically illustrating a portion of FIG. 4A. FIG. 4A to FIG. 4C schematically illustrate some regions and some configurations of the display panel 200. Hereinafter, an electronic panel according to some example embodiments of the inventive concept will be described in more detail with reference to FIG. 4A to FIG. 4C. Meanwhile, the same reference numerals are given to the same components as those described with reference to FIG. 1 to FIG. 3B, and some redundant descriptions thereof may be omitted.

As illustrated in FIG. 4A, the electronic panel EP may be divided into a plurality of light emitting regions LA(i,j)-LA(i+1,j+2) and a non-light emitting region NLA surrounding the light emitting regions LA(i,j)-LA(i+1,j+2). FIG. 4A illustrates an example portion in which 6 light emitting regions LA(i,j)-LA(i+1,j+2) are provided.

The light emitting regions LA(i,j)-LA(i+1,j+2) each emit light (e.g., a predetermined light). The 6 light emitting regions LA(i,j)-LA(i+1,j+2) may emit light of the same or different colors.

The non-light emitting region NLA may be a component separating or substantially separating the light emitting regions LA(i,j)-LA(i+1,j+2). The non-light emitting region NLA blocks light emitted to the periphery of the light emitting regions LA(i,j)-LA(i+1,j+2) to prevent or reduce light leakage and the like, allows the light emitting regions LA(i,j)-LA(i+1,j+2) to be more clearly partitioned.

A display element for generating light may be located in each of the light emitting regions LA(i,j)-LA(i+1,j+2). According to some example embodiments, the display element may be an organic light emitting element. Signal wirings for providing an electrical signal to display elements may be arranged such that it is overlapping the non-light emitting region NLA.

FIG. 4B illustrates an example equivalent circuit of a pixel PX(i,j). The pixel PX(i,j) receives a gate signal from an $i^{th}$ gate line GLi, and receives a data signal from a $j^{th}$ data line DLj. The pixel PX(i,j) receives a first power voltage from a power line KL.

The pixel PX(i,j) includes a first transistor TR1, a second transistor TR2, a capacitor CP, and a display element ED. According to some example embodiments, the display element ED may be an organic light emitting element. However, this is only an example and embodiments are not limited thereto. The display element ED according to some example embodiments of the inventive concept may be a liquid crystal capacitor, an electrophoretic element, an electrowetting element, or an inorganic light emitting element. Meanwhile, the configuration of the pixel PX(i,j) is not limited thereto, and may be modified and executed.

The first transistor TR1 outputs a data signal applied to the $j^{th}$ data line DLj in response to a gate signal applied to the $i^{th}$ gate line GLi. The capacitor CP charges a voltage corresponding to the data signal received from the first transistor TR1.

The second transistor TR2 is connected to the display element ED. The second transistor TR2 controls a driving current flowing in the display element ED in correspondence to the amount of charge stored in the capacitor CP. The display element ED emits light during a turn-on period of the second transistor TR2.

FIG. 4C is a cross-sectional view of a portion of the display panel 200 illustrated in FIG. 4A, and illustrates a region in which one pixel PX is located. FIG. 4C illustrates the second transistor TR2 (hereinafter, a thin film transistor) and the display element ED among components of the equivalent circuit illustrated in FIG. 4B. As illustrated in FIG. 4C, the display panel 200 may include a base substrate SUB, a plurality of insulation layers IL1, IL2, IL3, and IL4, the pixel PX, and an encapsulation layer ECL.

The base substrate SUB may have flexibility and insulation properties. The base substrate SUB may include, for example, a resin such as polyimide (PI). The insulation layers IL1, IL2, IL3, and IL4 may include first to fourth insulation layers IL1, IL2, IL3, and IL4 sequentially laminated along the third direction D3. Each of the first to fourth insulation layers IL1, IL2, IL3, and IL4 may include an inorganic film and/or an organic film, and may have a single layer or a multi-layer structure.

The thin film transistor TR2 is located on the base substrate SUB. The thin film transistor TR2 may include a semiconductor pattern SP, a control electrode CE, an input electrode IE, and an output electrode OE.

The semiconductor pattern SP is located between the base substrate SUB and the first insulation layer IL1. The control electrode CE is arranged such that it is overlapping the semiconductor pattern SP on a plane. The control electrode CE may be located between the first insulation layer IL1 and the second insulation layer IL2. However, this is only an example and embodiments are not limited thereto. The layer relationship between the control electrode CE and the semiconductor pattern SP may be changed. For example, the semiconductor pattern SP may be located on the control electrode CE, but is not limited to any one embodiment.

The input electrode IE and the output electrode OE are located between the second insulation layer IL2 and the third insulation layer IL3. The input electrode IE and the output electrode OE may be located on the same layer and be spaced apart from each other on a plane. Each of the input electrode IE and the output electrode OE is connected to the semiconductor pattern SP penetrating the first insulation layer IL1 and the second insulation layer IL2.

The display element ED is located on the third insulation layer IL3. The display element ED may include a first electrode ED1, a second electrode ED2, and a light emitting layer EM. According to the light emitting direction of the display element ED, the position of the first electrode ED1 and the second electrode ED2 may be switched. The first electrode ED1 is located on the third insulation layer IL3. The first electrode ED1 may be connected to the thin film transistor TR through the third insulation layer IL3.

The fourth insulation layer IL4 may have an opening OP for exposing at least a portion of the first electrode ED1. The light emitting layer EM may be located in the opening OP. A light emitting region LA may be defined corresponding to the light emitting layer EM.

The second electrode ED2 is located on the fourth insulation layer IL4. The second electrode ED2 is located not only in the light emitting region LA, but also in the non-light emitting region NLA.

The encapsulation layer ECL is located on the second electrode ED2. The encapsulation layer ECL overlaps both the light emitting region LA and the non-light emitting region NLA. The encapsulation layer ECL encapsulates the display element ED so as to prevent or reduce instances of external contaminants or moisture entering the display element ED, and may provide a flat surface on the front surface of the display panel 200.

The encapsulation layer ECL may include a first inorganic film IOL1, a second inorganic film IOL2, and an organic film OL. The organic film OL is located between the first inorganic film IOL1 and the second inorganic film IOL2. Meanwhile, this is only an example configuration, and embodiments are not limited thereto. The encapsulation layer ECL according to some example embodiments of the inventive concept may include a glass substrate. At this time, the encapsulation layer ECL may be arranged to be spaced apart from the display element ED by an interval (e.g., a predetermined interval).

Figure 5A:
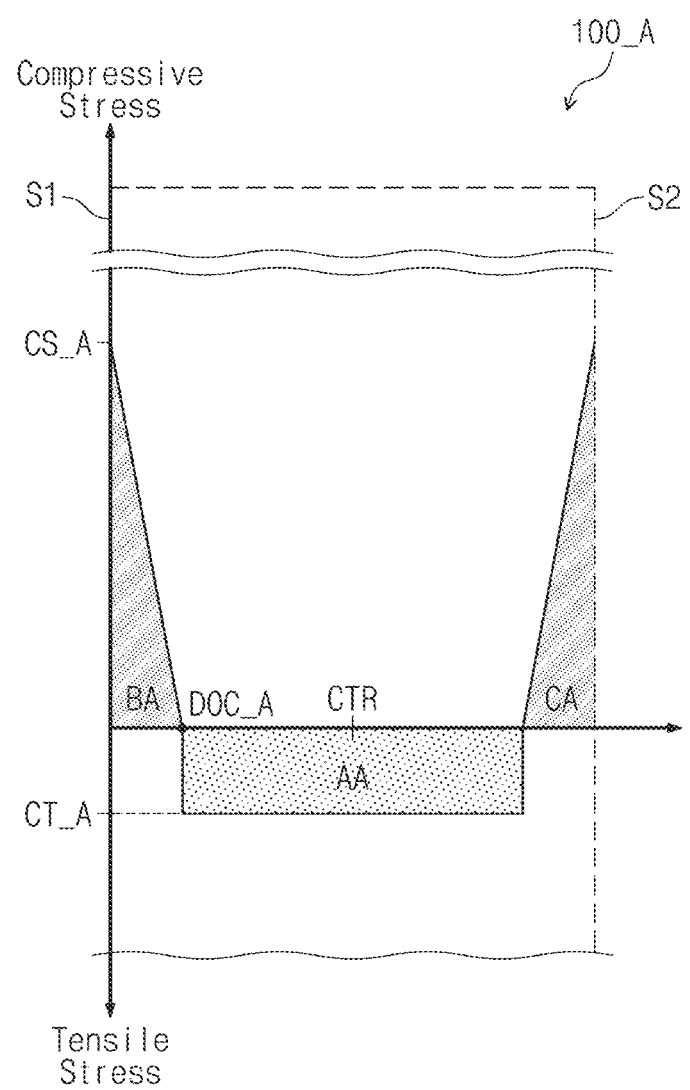
FIG. 5A is a graph illustrating an internal stress behavior of a window panel according to a comparative example.
Figure 5B:
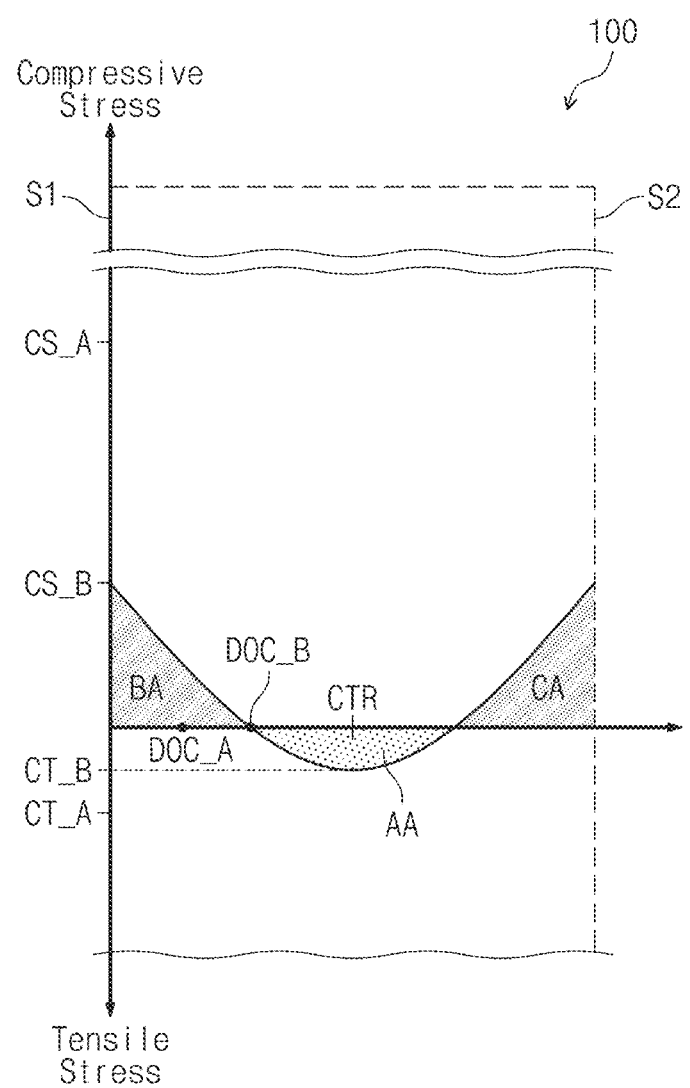
FIG. 5B is a graph schematically illustrating an internal stress behavior of a window panel according to some example embodiments of the inventive concept.

FIG. 5A is a graph schematically illustrating an internal stress behavior of a window panel according to a comparative example, and FIG. 5B is a graph schematically illustrating an internal stress behavior of a window panel according to some example embodiments of the inventive concept. FIG. 5A and FIG. 5B illustrate a window panel 100-A (hereinafter, a comparative panel) of a comparative example and the window panel 100 according to some example embodiments of the inventive concept with dotted lines, respectively. Hereinafter, aspects of some example embodiments of the inventive concept will be described with reference to FIG. 5A and FIG. 5B.

As illustrated in FIG. 5A and FIG. 5B, internal stress appearing in the panels 100 and 100-A may vary with depth. The internal stress includes compressive stress and tensile stress.

Meanwhile, the depth refers to a distance from surfaces of the panels 100-A and 100 when going toward the inside of the panels 100-A and 100 from the surfaces. For example, in a comparative panel 100-A, depth direction may be defined as a direction toward a center point CTR of the comparative panel 100-A from each of a first surface S1 and a second surface S2 along a direction parallel to the third direction D3. The center point CTR may be a point which is ½ of the thickness of the comparative panel 100-A.

In the same manner, in the window panel 100, a depth direction may be defined as a direction toward the center point CTR of the window panel 100 from each of a first surface S1 and a second surface S2 along the direction parallel to the third direction D3. The depth may be defined as a position that is symmetrical about the center point CTR which is ½ of the thickness of the window panel 100.

The stress behavior of each of the panels 100 and 100-A may include surface compressive stress, depth of compression, depth of layer, and center tensile stress. The surface compressive stress is compressive stress present on a surface, and may be compressive stress present on the first surfaces S1 and the second surfaces S2. FIG. 5A and FIG. 5B illustrate a surface compressive stress CS_A (hereinafter a first surface compressive stress) of the comparative panel 100-A, and a surface compressive stress CS-B (hereinafter, a second surface compressive stress) of the panel 100 according to some example embodiments of the inventive concept, respectively.

The depth of compression is a point at which internal compressive stress becomes 0 (zero), and may be a point at which compressive stress and tensile stress are in equilibrium. When the internal stress behavior is based on the compressive stress, the depth of compression may be defined as a point at which the compressive stress becomes 0.

The depth of layer may refer to a depth reached by ions penetrated into the panels 100 and 100-A during a reinforcement process, for example, a depth reached by alkali metal ions inside of the panels 100 and 100-A. FIG. 5A and FIG. 5B illustrate a depth of compression DOC_A (hereinafter a first depth of compression) of the comparative panel 100-A, and a depth of compression DOC_B (hereinafter, a second depth of compression) of the panel 100 according to some example embodiments of the inventive concept, respectively.

The central tension stress may be internal stress formed inside the panels 100 and 100-A corresponding to the compressive stress, and is generally represented by tensile stress opposite to the compressive stress. FIG. 5A and FIG. 5B illustrate first central tensile stress CT_A of the comparative panel 100-A, and second central tensile stress CT_B of the panel 100 according to some example embodiments of the inventive concept, respectively.

Because an area AA by a tensile stress behavior in a depth range beyond the depths of compression DOC_A and DOC_B is designed to be similar to the sum of an area BA by a compressive stress behavior from the first surface S1 to the depth of compression DOC_A and an area CA by a compressive stress behavior from the second surface S2 to the depth of compression DOC_B, the rigidity of the panels 100 and 100-A may be improved. Accordingly, the internal stress of the comparative panel 100-A may be balanced within the panels 100 and 100-A, and problems such as self-destruction of the comparative panel 100-A may be prevented. The panels 100 and 100-A may form tensile stress in response to compressive stress to minimize deformation due to the compressive stress and achieve a balance between the stress on the panels 100 and 100-A.

As illustrated in FIG. 5A, the comparative panel 100-A has the first surface compressive stress CS_A, the first depth of compression DOC_A, and the first central tensile stress CT_A on the surface thereof. The stress change in the comparative panel 100-A is illustrated as having a constant value in a section deeper than the first depth of compression DOC_A. A stress value at this time can be maintained as the first central tensile stress CT_A.

The internal stress behavior of the comparative panel 100-A illustrated in FIG. 5A may correspond to the behavior of a glass substrate chemically strengthened. For example, the internal stress behavior of the comparative panel 100-A shows an aspect in which a change in stress in a depth range not less than the first depth of compression DOC_A is maintained to be almost constant. For example, in a depth range not less than the first depth of compression DOC_A, the internal stress of the comparative panel 100-A may be maintained constant as the first central tensile stress CT_A.

Alternatively, referring to FIG. 5B, the window panel 100 according to some example embodiments of the inventive concept may have the second surface compressive stress CS_B, a second depth of layer, the second depth of compression DOC_B, and second central tensile stress CT_B. The second surface compressive stress CS_B may be less than the first surface compressive stress CS_A. The second surface compressive stress CS_B may be about 200 MPa or greater.

The second depth of compression DOC_B may be greater than the first depth of compression DOC_A. The second central tensile stress CT_B may be less than the first central tensile stress CT_A.

In the window panel 100, the second depth of compression DOC_B may satisfy the Relation Equation below.

$$0.15T \leq DOC \leq 0.3T,$$

where T is the thickness of a window panel.

According to the Relation Equation, the second depth of compression DOC_B may be designed to have a depth within a range of 15% to 30% of the thickness of the window panel 100.

The stress behavior of the window panel 100 according to some example embodiments of the inventive concept may show an aspect in which the slope thereof is constant or does not change much within a range up to a depth of compression at which compressive stress from a surface representing surface compressive stress, and tensile stress are equal in magnitude, thereby being in equilibrium. Also, the stress behavior of the window panel 100 may show an aspect in which the magnitude of stress varies within a range from the depth of compression to a point which is ½ of the thickness of the window panel 100. Such behavior may substantially correspond to a stress behavior profile according to thermal reinforcement.

For example, the stress behavior of the window panel 100 may show an aspect in which the stress behavior is changed in a depth range greater than the second depth of compression DOC_B. According to some example embodiments, in the window panel 100, the tension stress increases closer to the center of the window panel 100 and becomes maximum at the center of the window panel 100, and may correspond to the second central tensile stress CT_B. The stress behavior of the window panel 100 may correspond to the behavior of a glass substrate thermally strengthened.

Although not shown in the stress behavior, during a reinforcement treatment process of the window panel 100, the depth of layer may be controlled to be greater than a depth (e.g., a predetermined depth). When the window panel 100 according to some example embodiments of the inventive concept is subjected to a reinforcement treatment process using a single salt, the depth of layer may be controlled to be 0.5 T or greater. Alternatively, when the window panel 100 according to some example embodiments of the inventive concept is subjected to a reinforcement treatment process using a mixed salt, the depth of layer may be controlled to be 0.3 T or greater. Because the depth of layer is controlled to be greater than a depth (e.g., a predetermined depth), the window panel 100 may have a strengthened stress behavior profile thermally strengthened, and may have improved strength and impact resistance while having a thickness of a thin film.

Table 1 below illustrates results of performing a reinforcement treatment process using a single salt on samples which belong to two groups EX_A and EX_B having different thicknesses. Referring to Table 1 below, a reinforcement treatment process using a single salt in which depth of layer is designed to be ½ of a thickness or greater will be described.

TABLE 1

| Reinforcement treatment process conditions | | EX_A | | | EX_B | | |
|---|---|---|---|---|---|---|---|
| Temperature (° C.) | Time (min) | CS (MPa) | DOL (μm) | CT (MPa) | CS (MPa) | DOL (μm) | CT (MPa) |
| 420 | 30 | 1060 | 11 | 17 | 720 | 11 | 283 |
|  | 60 | 1050 | 15 | 25 | 680 | 16 | 604 |
|  | 120 | 1040 | 21 | 33 | Self-destruction | — | — |
|  | 180 | 1030 | 26 | 41 | Self-destruction | — | — |

TABLE 1-continued

| Reinforcement treatment process conditions | | EX_A | | | EX_B | | |
| --- | --- | --- | --- | --- | --- | --- | --- |
| Temperature (° C.) | Time (min) | CS (MPa) | DOL (μm) | CT (MPa) | CS (MPa) | DOL (μm) | CT (MPa) |
| | 240 | 1020 | 29 | 46 | 500 | 21.0 | 1312 |
| | 300 | 1010 | 33 | 52 | 407 | 19.9 | 794 |
| | 360 | 1005 | 36 | 57 | 353 | 19.3 | 597 |

Referring to Table 1, a first group EX_A includes results of applying a reinforcement treatment process using a single salt to each sample of a glass material having a thickness of about 700 μm. A second group EX_B includes results of applying a reinforcement treatment process using a single salt to each sample of a glass material having a thickness of about 50 μm. Referring to the first group EX_A, in samples of a glass material each having a thickness of about 700 μm, the surface compressive stress CS was gradually reduced as reinforcement treatment process time was increased. On the other hand, the depth of layer DOL and the central tensile stress CT were increased as the reinforcement treatment process time was increased.

As described above, because the reinforcement treatment process is a process in which samples are exposed to a single salt, as the reinforcement treatment process time is increased, the depth of layer DOL corresponding to a depth reached by the single salt penetrated into the samples is increased.

On the other hand, referring to the second group EX_B, in samples of a glass material each having a thickness of about 50 μm, the surface compressive stress CS was gradually reduced as the reinforcement treatment process time was increased, and then self-destruction defects occurred in a period (e.g., a predetermined period) (120 minutes to 180 minutes). However, in a period exceeding 180 minutes (240 minutes to 360 minutes), self-destruction defects did not occur so that it was possible to measure surface compressive stress CS, and the surface compressive stress CS was gradually reduced as the reinforcement treatment process time was increased even in the period.

Because the samples were damaged due to the occurrence of self-destruction defects in the period in which the self-destruction defects occurred (120 minutes to 180 minutes), it was difficult to measure the surface compressive stress CS, the depth of layer DOL and the central tensile stress CT, and thus the results thereof were not shown in Table 1 above. Among the above, the depth of layer DOL was similar to that in the first group EX_A. According to some example embodiments, when the depth of layer DOL is defined as the maximum depth penetrable by ions from a surface, and if the self-destruction defects had not occurred, the depth of layer DOL of the second group EX_B is expected to be about 21 μm at 120 minutes and about 26 μm at 180 minutes in correspondence to that in the first group EX_A.

In a period after the occurrence of the self-destruction defects (240 minutes to 360 minutes), self-destruction defects did not occur, so that it was possible to measure the depth of layer DOL. The depth of layer DOL was lower than the depth of layer DOL measured in the first group EX_A of a thickness of 700 μm, and was rather reduced as the treatment process time was increased. The error may have been caused by a method for measuring the depth of layer DOL in which the depth of layer DOL is defined as a point at which the concentration of the ions is the highest within a thickness range of a sample.

For example, when the depth of layer DOL in the first group EX_A having a thickness of 50 μm is designed to be 25 μm or greater, which is the half of the thickness of the sample, because a penetration region of ions penetrated from one surface and a penetration region of ions penetrated from the other surface overlap each other, the point with the highest ion concentration is measured to be 25 μm or less, which is less than the half of the thickness of the sample. Also, because the depth of layer DOL is designed to be increased as the reinforcement treatment process time is increased, a result value measured as the depth of layer DOL is decreased.

In the step of a reinforcement treatment using a single salt according to some example embodiments of the inventive concept, an actual measured depth and a designed depth may differ from each other. Within a range of 0.5 T or less, a designed depth and an actual measured depth may correspond to each other, but in a range of 0.5 T or greater, an actual measured depth may be less than a designed depth. The error may have been caused in that an actual measurement of the depth of layer DOL was performed by finding a point having the highest ion concentration within the thickness range of the sample.

Hereinafter, according to some example embodiments, the depth of layer DOL is classified into a designed value and a measured value. The designed value is to control ion concentration, temperature, or time so as to have the corresponding depth of layer, and the measured value may refer to a result value obtained by measuring a substrate which has been subjected to a reinforcement treatment through a measurement equipment such as a surface stress measuring device (FSM). The depth of layer DOL as referred to herein may substantially correspond to the designed depth. That is, the depth of layer DOL according to some example embodiments of the inventive concept may be interpreted as the maximum depth penetrable by ions. According to some example embodiments of the inventive concept, by controlling process time and temperature during a reinforcing treatment process using a single salt such that the depth of layer DOL is designed to be 0.5 T or greater, it may be possible to stably provide the window panel 100 with reduced self-destruction defects and the surface compressive stress CS of 200 MPa or greater while having a thickness of a thin film of 100 μm or less.

According to some example embodiments of the inventive concept, the window panel 100 having a stress behavior corresponding to the behavior of a glass substrate thermally strengthened through a chemical reinforcement treatment using an ion exchange method may be formed. According to some example embodiments of the inventive concept, by controlling a chemical reinforcement treatment of the window panel 100 having a thickness of a thin film, it is possible to design such that the window panel 100 has a stress behavior thermally strengthened. Accordingly, the window panel 100 even with a thickness of a thin film may have improved strength.

Figure 6A:
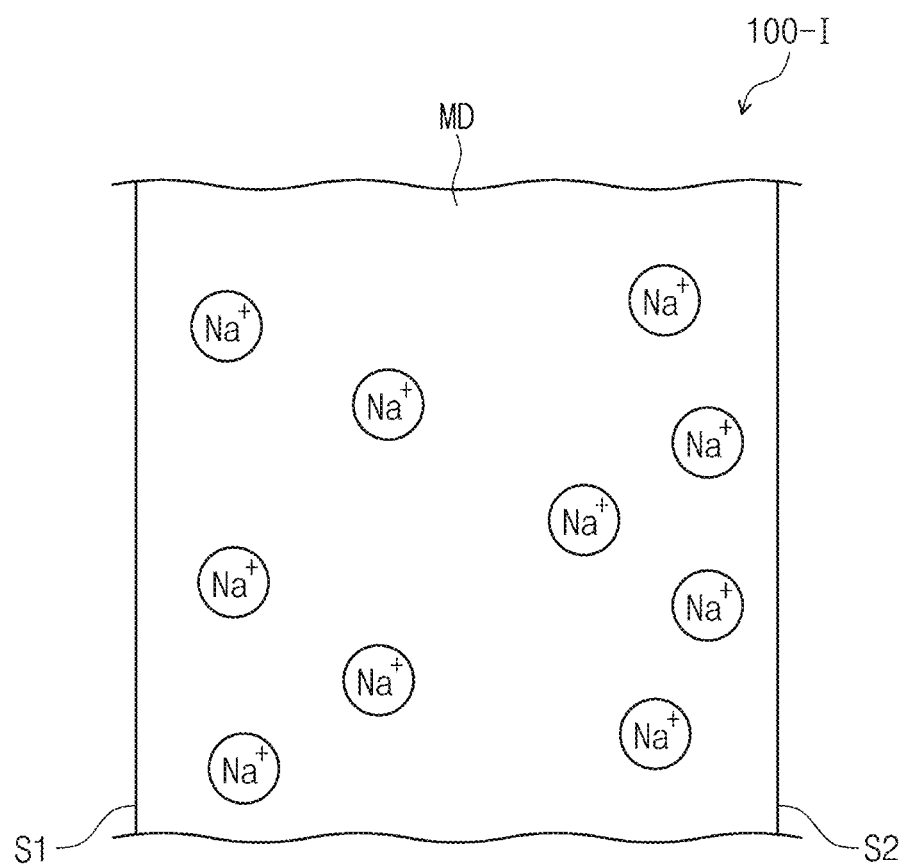
FIG. 6A to FIG. 6C are views schematically illustrating a method for manufacturing a window panel according to some example embodiments of the inventive concept.
Figure 6B:
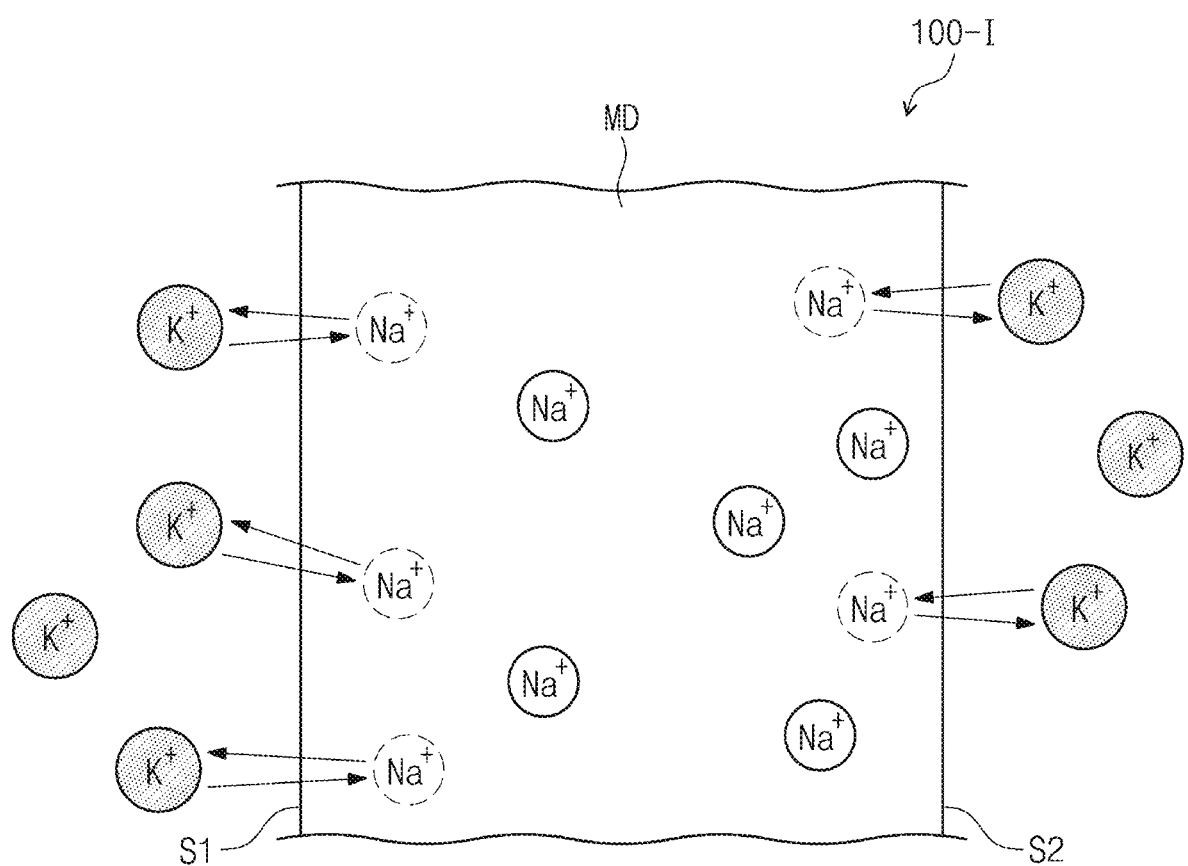
Figure 6C:
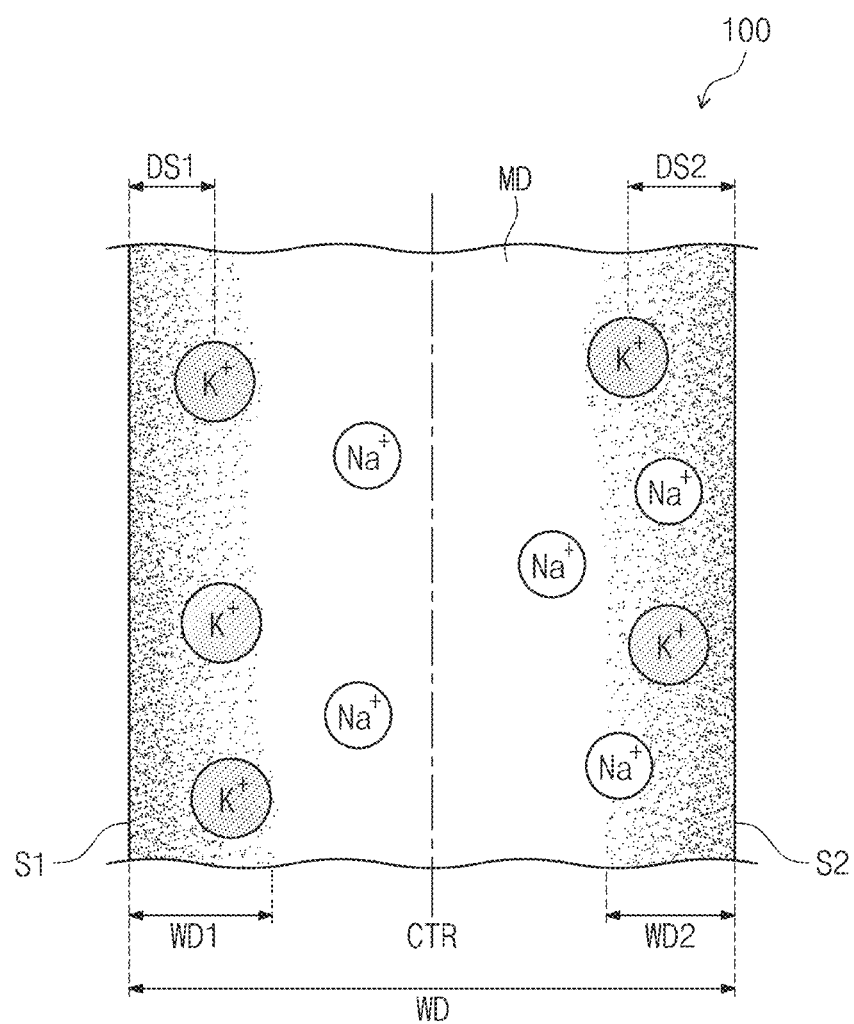

FIG. 6A to FIG. 6C are views schematically illustrating a method for manufacturing a window panel according to some example embodiments of the inventive concept. For ease of description, FIG. 6A to FIG. 6C illustrate a chemical reinforcement process of the window panel 100, and schematically illustrate a change on a plane defined by the second direction D2 and the third direction D3. Hereinafter, further details of some example embodiments of the inventive concept will be described with reference to FIG. 6A to FIG. 6C.

As illustrated in FIG. 6A, an initial window panel 100-I is provided. The initial window panel 100-I may include an insulation substrate. In the present embodiment, the initial window panel 100-I may be a glass substrate.

The initial window panel 100-I may include a substrate MD and a first ion ($Na^+$). In the present embodiment, the first ion ($Na^+$) may include a sodium ion. The first ion ($Na^+$) may be provided in plurality and the plurality of first ions may be dispersed and located in the substrate MD.

Meanwhile, the initial window panel 100-I may be a glass substrate from which a lithium compound ($Li_2O$), a boron compound ($B_2O_3$), or a phosphorus compound ($P_2O_5$) is removed. The initial window panel 100-I according to some example embodiments of the inventive concept may include a glass substrate composed of various material without being limited to a material thereof, but is not limited to any one embodiment.

Hereinafter, as illustrated in FIG. 6B, the initial window panel 100-I is immersed in a metal salt to reinforce the initial window panel 100-I. In the present embodiment, a reinforcement step of the initial window panel 100-I may be a chemical reinforcement step. For example, the initial window panel 100-I may be strengthened by an ion exchange method. In the reinforcement step, the temperature may be set to a temperature range of 350° C. to 460° C., and to a time range of 30 minutes to 360 minutes.

The metal salt may include second ion ($K^+$) different from the first ion ($Na^+$). The second ion ($K^+$) may each have a greater radius than the first ion ($Na^+$). Meanwhile, the second ion may contain an alkali metal ion. In the present embodiment, the second ion ($K^+$) may include a potassium ion ($K^+$).

The second ions ($K^+$) may be substituted with the first ions (Na+). In the present embodiment, the substitution between the second ions ($K^+$) and the first ions ($Na^+$) may be a one-to-one substitution. Accordingly, some ions of the alkali metal ions included in the metal salt may be exchanged with the first ions ($Na^+$) and dispersed in the substrate MD.

The metal salt may be provided in various forms. For example, the metal salt may be provided in a molten liquid ion salt state. Meanwhile, in the present embodiment, the metal salt may be provided as a single salt or a mixed salt. For example, the metal salt may be a single salt composed of 100% potassium nitrate ($KNO_3$).

Alternatively, the metal salt may be a mixed salt containing at least two different alkali metal salts. For example, when ions dispersed in the initial window panel 100-I are sodium ions ($Na^+$), the metal salt may include a mixed salt in which potassium nitrate ($KNO_3$) and sodium nitrate ($NaNO_3$) are mixed at a ratio (e.g., a predetermined ratio). At this time, the mixing ration may be a ratio of X:(10-X).

Referring to FIG. 6C, the initial window panel 100-I may be formed to be the window panel 100 through the reinforcement step. The window panel 100 may include the substrate MD, and the second ion ($K^+$) and the first ion ($Na^+$) dispersed in the substrate MD.

In the present embodiment, the second ions (K+) may generate internal stress in the window panel 100. As described above, the second ions (K+) each have a greater radius than the first ions (Na+). Accordingly, the internal stress formed by the second ions ($K^+$) may be compressive stress. For ease of description, FIG. 6C illustrates a region in which compressive stress is generated shaded.

As illustrated in FIG. 6C, in the window panel 100, compressive stress by the second ions ($K^+$) may be present from the first surface S1 to a first depth WD1. In the same manner, compressive stress by the second ions ($K^+$) may be present from the second surface S2 to a second depth WD2. Each of the first depth WD1 and the second depth WD2 may substantially correspond to the second depth of compression DOC_B (see FIG. 5B).

Accordingly, the first depth WD1 and the second depth WD2 according to the inventive concept may be substantially designed to be 0.15 times to 0.3 times of a thickness WD of the window panel 100, respectively. For example, the thickness WD of the window panel 100 may be less than 100 μm. According to the inventive concept, by designing each of the first depth WD1 and the second depth WD2 to be within a range (e.g., a predetermined range), the internal stress behavior of the window panel 100 may appear similar to the internal stress behavior which has been subjected to thermal reinforcement.

Meanwhile, FIG. 6C illustrates maximum depths DS1 and DS2 in which the second ions ($K^+$) penetrate from the surfaces S1 and S2 of the window panel 100 to the inside thereof. For example, a depth in which the second ions ($K^+$) penetrate from the first surface S1 is illustrated as a first distance DS1, and a depth in which the second ions ($K^+$) penetrate from the second surface S2 is illustrated as a second distance DS2, Each of the first distance DS1 and the second distance DS2 may substantially correspond to the depth of layer described above. In FIG. 6C, for ease of description, the first distance DS1 and the second distance DS2 are illustrated to be at positions spaced apart from each other, but the actual depth of layer may be different from the first and second distances DS1 and DS2 illustrated in FIG. 6C.

According to some example embodiments of the inventive concept, when the metal salt is provided as a single salt, the first distance DS1 and the second distance DS2 may be controlled to be equal to or greater than 0.5 times the thickness WD of the window panel 100. That is, in a reinforcement treatment process using a single salt, the depth of layer of ions injected into one surface S1 or S2 may be designed to be over the center point CTR or beyond.

Alternatively, when the metal salt is provided as a mixed salt, the first distance DS1 and the second distance DS2 may be controlled to be equal to or greater than 0.3 times the thickness WD of the window panel 100.

According to some example embodiments of the inventive concept, by controlling the first distance DS1 and the second distance DS2, the depth of compression may be designed to be 0.15 times to 0.3 times of the thickness WD of the window panel 100 as described above, and a stress behavior similar to that of a window panel which has been subjected to thermal reinforcement may be implemented.

Meanwhile, according to some example embodiments, the first depth WD1 and the second depth WD2, and the first distance DS1 and the second distance DS2 are illustrated to be symmetrical about the center point CTR, respectively. However, this is only an example. The first depth WD1 and the second depth WD2, and the first distance DS1 and the second distance DS2 may be formed differently depending on the concentration of the second ions ($K^+$) penetrated through the first surface S1 and the second surface S2, and the position or concentration of the first ions ($Na^+$) dispersed adjacent to the first surface S1 and the second surface S2, but are not limited to any one embodiment.

The window panel 100 according to some example embodiments of the inventive concept may have an internal stress behavior similar to the internal stress behavior of a window panel which has been subjected to thermal reinforcement and a chemical reinforcement step through an ion exchange. At this time, the value of the central tensile stress may be reduced and the depth of layer may be increased, so that self-destruction defects may be reduced and improved reliability against external impact may be achieved.

Figure 7A:
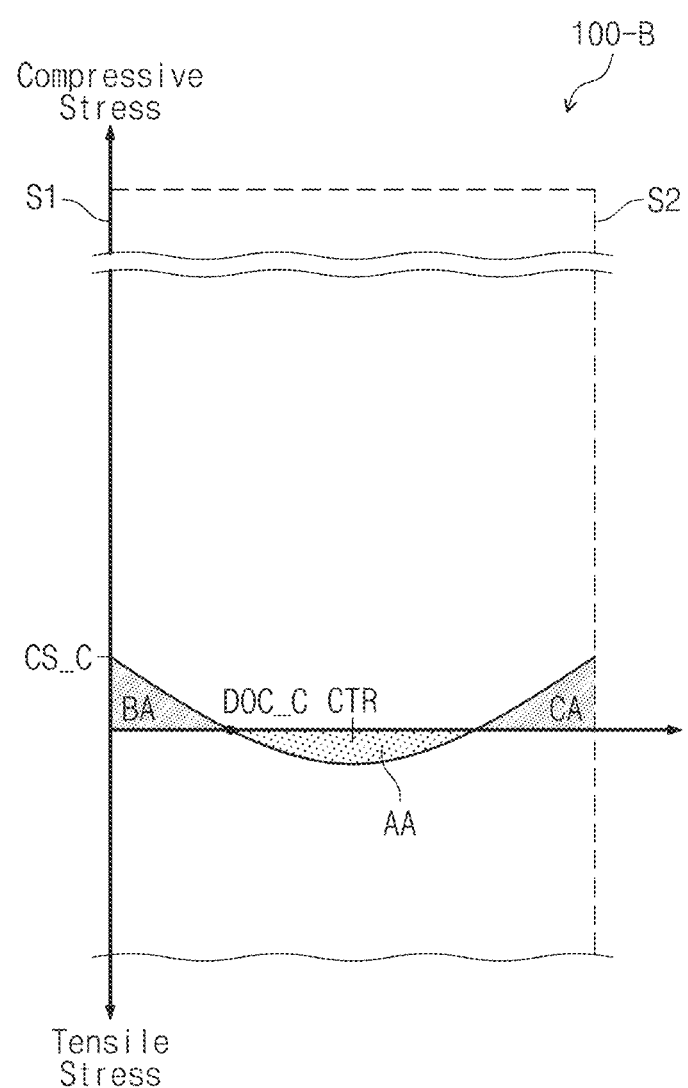
FIG. 7A and FIG. 7B are graphs illustrating an internal stress behavior of a window panel according to some example embodiments of the inventive concept.
Figure 7B:
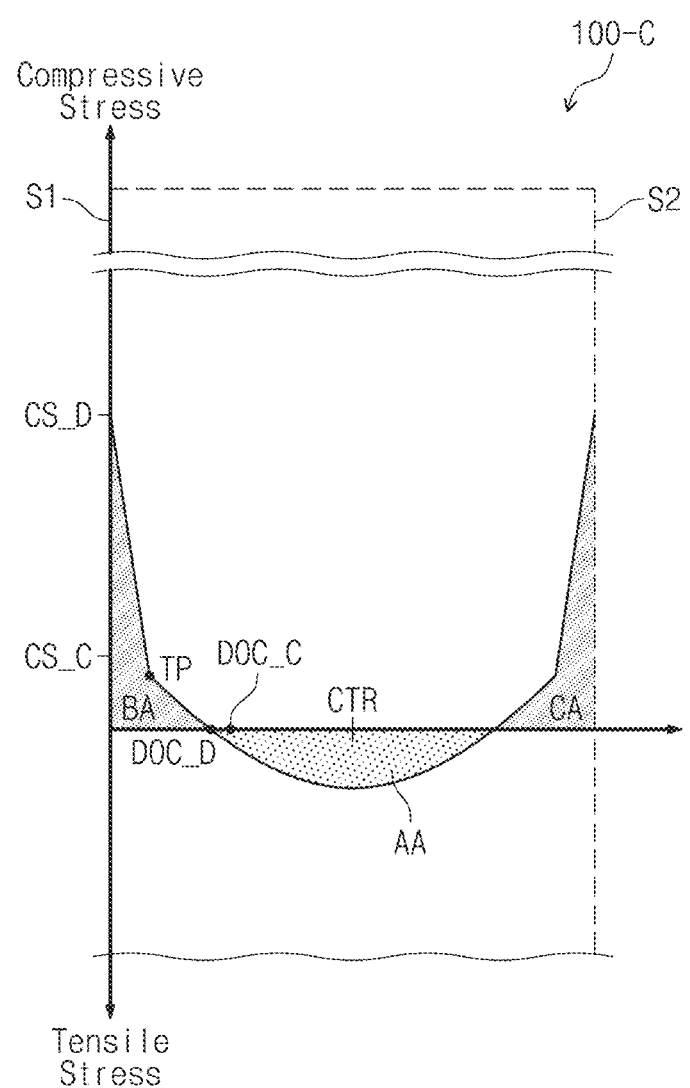

FIG. 7A and FIG. 7B are graphs illustrating an internal stress behavior of a window panel according to some example embodiments of the inventive concept. For ease of description, FIG. 7A and FIG. 7B are illustrated to correspond to FIG. 6B. Hereinafter, aspects of some example embodiments of the inventive concept will be described in more detail with reference to FIG. 7A and FIG. 7B. Meanwhile, the same reference numerals are given to the same components as those described with reference to FIG. 1 to FIG. 6C, and redundant descriptions thereof are omitted.

According to some example embodiments of the inventive concept, a window panel 100-C may be subjected to a plurality of reinforcement steps. For example, the window panel 100-B which has been subjected to a primary reinforcement treatment may be subjected to a secondary reinforcement treatment to form the window panel 100-C. For ease of description, FIG. 7A illustrates the internal stress behavior of the window panel 100-B which has been subjected to a primary reinforcement step, and FIG. 7B illustrates the internal stress behavior of the window panel 100-C which has been subjected to a secondary reinforcement step.

As illustrated in FIG. 7A, the window panel 100-B which has been subjected to the primary reinforcement step may have a behavior similar to the stress behavior of the window panel 100 illustrated in FIG. 6B. That is, the window panel 100-B which has been subjected to the primary reinforcement step may have a behavior similar to the behavior of a glass which has been subjected to a thermal reinforcement treatment. Surface compressive stress CS_C of the window panel 100-B may appear to be about 100 MPa or greater.

The primary reinforcement step according to some example embodiments of the inventive concept may be a chemical reinforcement step. The primary reinforcement step includes an ion exchange step through a mixed salt. The mixed salt may contain at least two different alkali metal salts different from each other. For example, the primary reinforcement step may include a step of impregnating with a metal salt in which potassium nitrate ($KNO_3$) and sodium nitrate ($NaNO_3$) are mixed in a ratio of X:(10-X). The temperature may be set to a temperature range of 350° C. to 460° C., and to a time range of 30 minutes to 360 minutes. At this time, in the primary reinforcement step, the depth of layer in the window panel 100-B may be controlled to be equal to or greater than 0.3 times the thickness of the window panel 100-B.

Thereafter, as illustrated in FIG. 7B, the window panel 100-C which has been subjected to the secondary reinforcement step may have an internal stress behavior which varies according a depth. The internal stress behavior of the window panel 100-C which has been subjected to the secondary reinforcement step may exhibit a behavior in which the surface compressive stress, depth of compressive stress, and central tensile stress are changed from the internal stress behavior of the window panel 100-B which has been subjected to the primary reinforcement step.

For example, surface compressive stress CS_D of the window panel 100-C which has been subjected to the secondary reinforcement step may be greater than the surface compressive stress CS_C of the window panel 100-B which has been subjected to the primary reinforcement step.

According to some example embodiments, the surface compressive stress CS_D of the window panel 100-C which has been subjected to the secondary reinforcement step may be about 500 MPa or greater.

For example, a depth of compression DOC_D of the window panel 100-C which has been subjected to the secondary reinforcement step may be decreased to be smaller than a depth of compression DOC_C of the window panel 100-B which has been subjected to the primary reinforcement step.

Meanwhile, the internal stress behavior of the window panel 100-C which has been subjected to the secondary reinforcement step may further include a transition point (e.g., a predetermined transition point) TP. The transition point TP may be generated in a depth region equal to or less than the depth of compressions DOC_D. With respect to the internal stress behavior of the window panel 100-C, the slope of the internal stress behavior may be changed based on the transition point TP. According to some example embodiments, the transition point TP may be equal to or less than about 0.2 times the thickness of the window panel 100-D. Because the stress behavior of the window panel 100-C which has been subjected to the secondary reinforcement further includes the transition points TP, the average magnitude of tensile stress required in a depth range greater than the depth of compression DOC_D may be reduced.

The secondary reinforcement step according to some example embodiments of the inventive concept may be a chemical reinforcement step. The secondary reinforcement step includes an ion exchange step through a single salt. The single salt may include a single alkali metal salt. For example, the secondary reinforcement step may include a step of impregnating with a metal salt of 100% potassium nitrate ($KNO^3$). The temperature may be set to a temperature range of 350° C. to 460° C., and to a time range of 240 minutes or less. At this time, the reinforcement environment may be an environment in which the depth of layer (design value) of $K^+$ ions is controlled to be less than 0.2 times the thickness of the window panel 100-C. In the secondary reinforcement step, by designing the process environment such that the depth of layer is less than 0.2 times the thickness, a transition point TP at which the slope of an internal stress behavior is changed is obtained, and reinforcement glass of a thin film with improved impact resistance may be provided.

According to some example embodiments of the inventive concept, through two reinforcement steps, the window panel 100-C may have high surface compressive stress CS-D while having an internal stress behavior similar to that of a window panel which has been subjected to thermal reinforcement. According to some example embodiments of the inventive concept, even through the window panel 100-C is thin, sufficient reliability thereof may be secured. Accordingly, a flexible window panel with improved reliability may be provided.

Figure 8A:
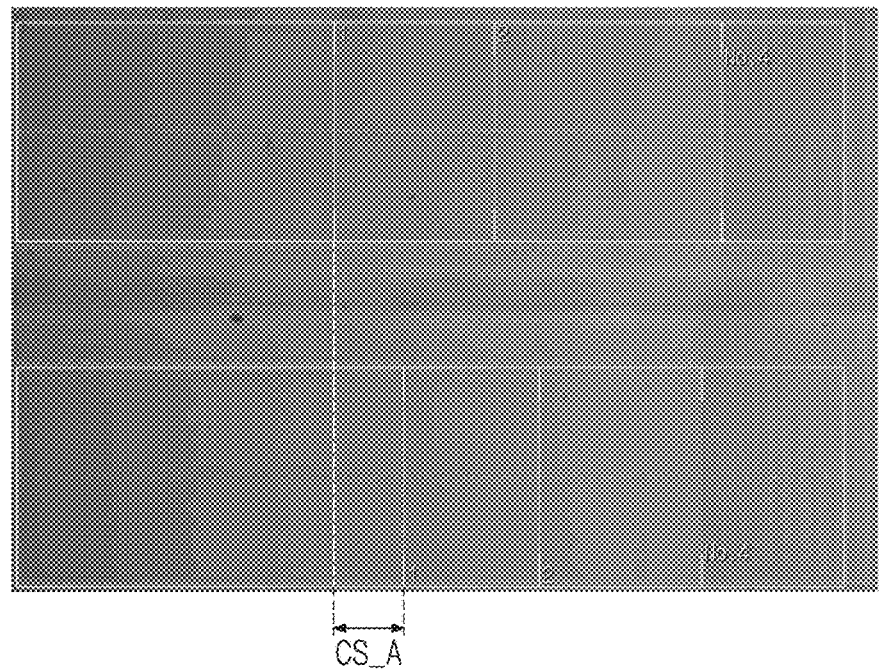
FIG. 8A is a photograph showing the results of measuring the surface stress of a comparative example.
Figure 8B:
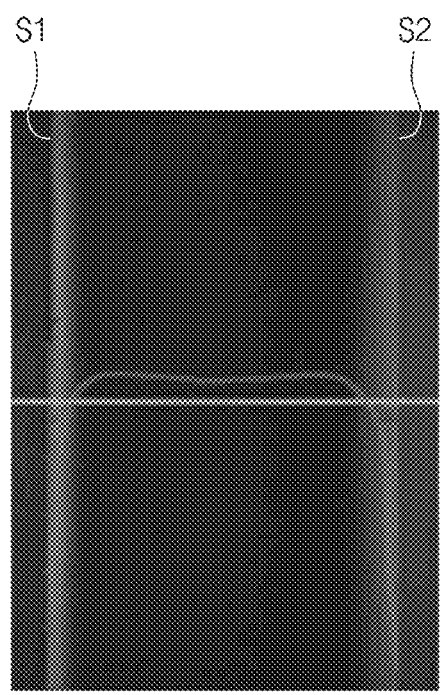
FIG. 8B is a photograph illustrating an internal stress behavior of a comparative example.
Figure 9A:
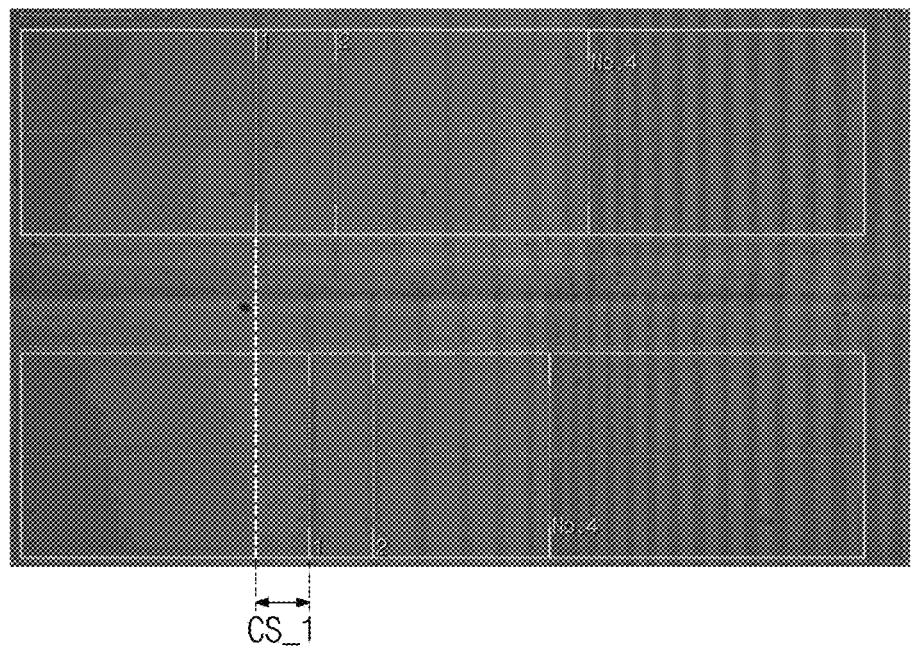
FIG. 9A is a photograph of surface stress of a window panel according to some example embodiments of the inventive concept.
Figure 9B:
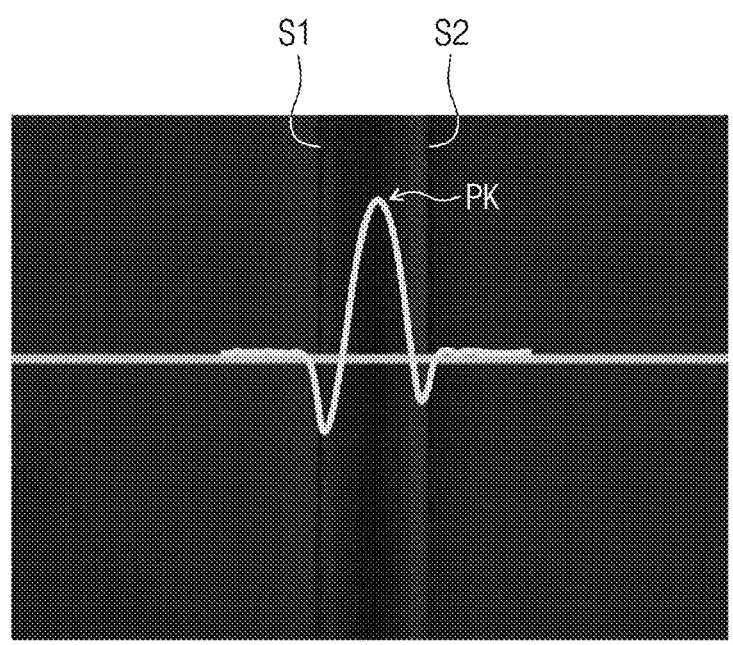
FIG. 9B is a photograph illustrating an internal stress behavior of a window panel according to some example embodiments of the inventive concept.
Figure 10A:
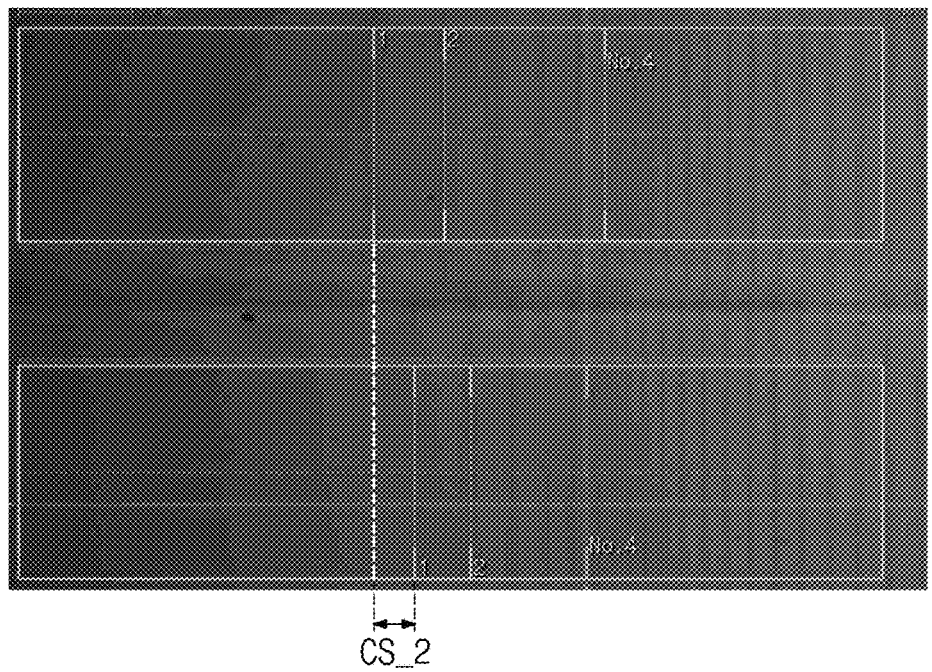
FIG. 10A is a photograph of surface stress of a window panel according to some example embodiments of the inventive concept.
Figure 10B:
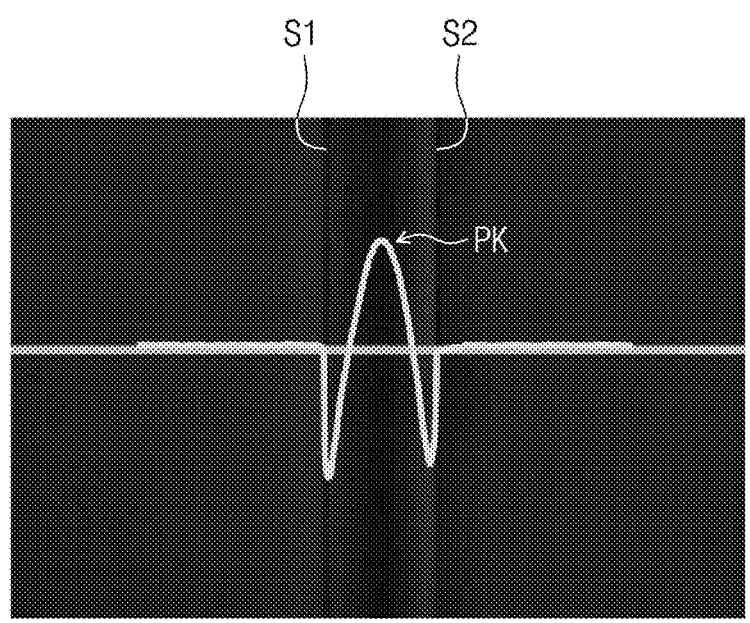
FIG. 10B is a photograph illustrating an internal stress behavior of a window panel according to some example embodiments of the inventive concept.
Figure 11A:
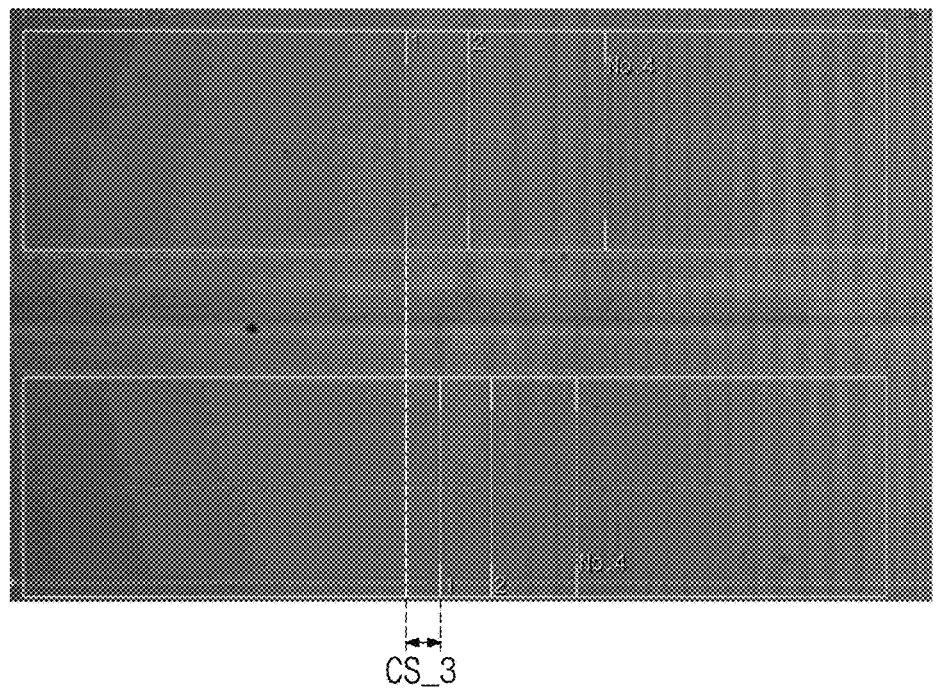
FIG. 11A is a photograph of surface stress of a window panel according to some example embodiments of the inventive concept.
Figure 11B:
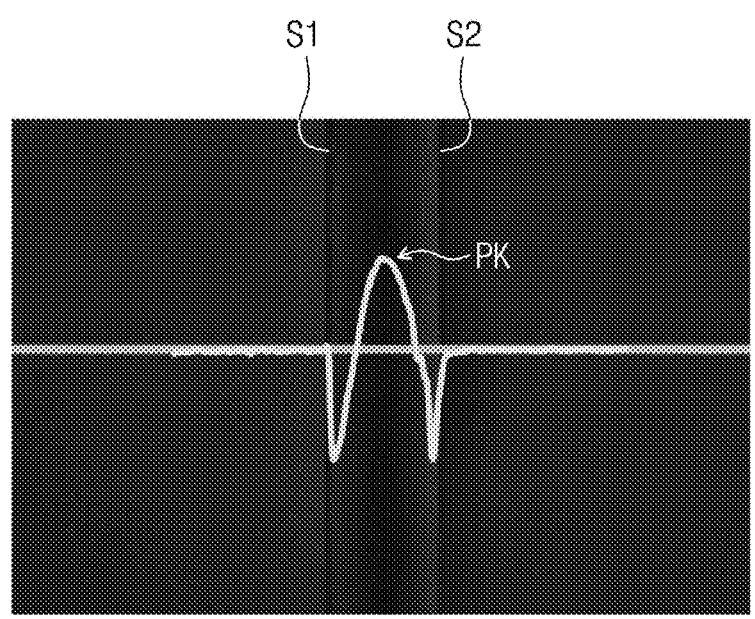
FIG. 11B is a photograph illustrating an internal stress behavior of a window panel according to some example embodiments of the inventive concept.

FIG. 8A is a photograph of surface stress of a comparative example, and FIG. 8B is a photograph illustrating an internal stress behavior of a comparative example. FIG. 9A is a photograph of surface stress of a window panel according to some example embodiments of the inventive concept, and FIG. 9B is a photograph illustrating an internal stress behavior of a window panel according to some example embodiments of the inventive concept. FIG. 10A is a photograph of surface stress of a window panel according to some example embodiments of the inventive concept, and FIG. 10B is a photograph illustrating an internal stress behavior of a window panel according to some example embodiments of the inventive concept. FIG. 11A is a photograph of surface stress of a window panel according to some example embodiments of the inventive concept, and FIG. 11B is a photograph illustrating an internal stress behavior of a window panel according to some example embodiments of the inventive concept.

FIG. 8A, FIG. 9A, FIG. 10A, and FIG. 11A are photographs showing the results measured by a film stress measuring device (FSM), and vertical line-shaped fringes are shown such that surface compressive stress and depth of layer are calculated. The surface compressive stress and the depth of layer may be obtained by the vertical line-shaped fringes and a photo-elastic coefficient.

FIG. 8B, FIG. 9B, FIG. 10B, and FIG. 11B are each photographs of an internal stress behavior, which may be obtained by capturing a cross-section of a window panel. FIG. 8B, FIG. 9B, FIG. 10B, and FIG. 11B may each correspond to an inverted form of the graph illustrated in FIG. 5B. Accordingly, in FIG. 8B, FIG. 9B, FIG. 10B, and FIG. 11B, the upper side represents tensile stress, and the lower side represents compressive stress.

Meanwhile, FIG. 8A to FIG. 11B illustrate results measured based on samples each having a thickness of 0.05 mm. Hereinafter, aspects of some example embodiments of the inventive concept will be described with reference to FIG. 8A to FIG. 11B.

FIG. 8A and FIG. 8B may correspond to the result values for the comparative example illustrated in FIG. 5A. For example, the comparative embodiment may be a window panel obtained by being subjected to a reinforcement treatment at 420° C. for 60 minutes. Referring to FIG. 8A, in the comparative example, the surface compressive stress $CS\_A$ is 715 MPa and the depth of layer is 9.4 μm. The depth of layer may be represented by 0.188 T (T is the thickness of a panel). That is, in the comparative example, the depth of layer is designed to be less than 0.5 T.

Accordingly, as illustrated in FIG. 8B, the comparative example has a typical chemically-strengthened internal stress behavior. The stress behavior according to the comparative example has relatively low depth of layer as compared to having high surface compressive stress, so that the compressive stress may be strongly concentrated in a region close to the surface. In a thin panel, central tensile stress formed to be at a high value for internal stress equilibrium, and accordingly, self-destruction defects may be more likely to be generated.

On the other hand, as illustrated in FIG. 9A and FIG. 9B, a first sample according to some example embodiments of the inventive concept has a thermally-strengthened internal stress behavior. The first sample may be a window panel obtained by being subjected to a reinforcement treatment at 420° C. for 240 minutes. The reinforcement is a chemical reinforcement, and may include a step of impregnating with a single salt composed of 100% potassium nitrate ($KNO_3$).

Referring to FIGS. 9A and 9B, the depth of layer is controlled to be about 30 μm. Accordingly, the depth of layer may be represented by 0.6 T (T is the thickness of a panel). That is, the depth of layer of the first sample is designed to be 0.5 T or greater. Meanwhile, the surface compressive stress $CS\_1$ of the first sample is about 512 MPa. For ease of description, FIG. 9B illustrates an enlarged version of FIG. 8B, and FIG. 9B shows a compressive stress substantially lower than the compressive stress illustrated in FIG. 8B.

As illustrated in FIG. 10A and FIG. 10B, a second sample according to some example embodiments of the inventive concept has a thermally-strengthened internal stress behavior. The second sample may be a window panel obtained by being subjected to a reinforcement treatment at 420° C. for 300 minutes. The reinforcement is a chemical reinforcement, and may include a step of impregnating with a single salt composed of 100% potassium nitrate ($KNO_3$).

Referring to FIGS. 10A and 10B, the depth of layer of the second sample is controlled to be about 32 μm. Accordingly, the depth of layer may be represented by 0.64 T, and the depth of layer of the second sample is designed to be 0.5 T or greater. Meanwhile, the surface compressive stress $CS\_2$ of the second sample is about 404 MPa. For ease of description, FIG. 10B illustrates an enlarged version of FIG. 8B and shows a compressive stress substantially lower than the compressive stress illustrated in FIG. 8B.

As illustrated in FIG. 11A and FIG. 11B, a third sample according to some example embodiments of the inventive concept has a thermally-strengthened internal stress behavior. The third sample may be a window panel obtained by being subjected to a reinforcement treatment at 420° C. for 360 minutes. The reinforcement is a chemical reinforcement, and may include a step of impregnating with a single salt composed of 100% potassium nitrate ($KNO_3$).

Referring to FIGS. 11A and 11B, the depth of layer of the third sample is controlled to be about 36 μm. Accordingly, the depth of layer may be represented by 0.72 T, and the depth of layer of the third sample is designed to be 0.5 T or greater. Meanwhile, the surface compressive stress $CS\_3$ of the third sample is about 336 MPa. For ease of description, FIG. 11B illustrates an enlarged version of FIG. 8B and shows a compressive stress substantially lower than the compressive stress illustrated in FIG. 8B.

Referring to FIG. 9A to FIG. 11B, the depth of layer of each of the first to third samples corresponding to a window panel according to some example embodiments of the inventive concept is designed to be 0.5 T or greater. On the other hand, the surface compressive stress $CS\_1$, $CS\_2$, and $CS\_3$ of the first to third samples is designed to be less than 715 MPa, which is the surface compressive stress $CS\_A$ of a comparative example. That is, the first to third samples are designed to have depth of layer of 0.5 T or greater in the step of impregnating with a single salt, so that surface compressive stress generated by ion penetration may be dispersed from the surface of each sample to the inside thereof. According to some example embodiments, the depth of compression DOC may be designed to be about 0.15 T to 0.3 T.

According to some example embodiments of the inventive concept, instances of surface compressive stress being excessively increased may be prevented or reduced, and instances of compressive stress being concentrated in a surface region may be prevented or reduced. Also, central tensile stress may be reduced for internal stress equilibrium. Accordingly, even in a thin window panel, the occurrence of self-destruction defects and the like may be stably prevented or reduced, and the impact resistance and strength of the window panel may be improved.

A window panel according to some example embodiments of the inventive concept may have an internal stress behavior similar to a thermally-strengthened internal stress behavior. A window panel according to some example embodiments of the inventive concept may have significant depth of layer. Accordingly, even if the surface compressive stress of the window panel is slightly reduced, because the depth of layer has been designed to be significant, the problem of self-destruction defects of the window panel may be solved, and the improved reliability thereof may be obtained.

Figure 12A:
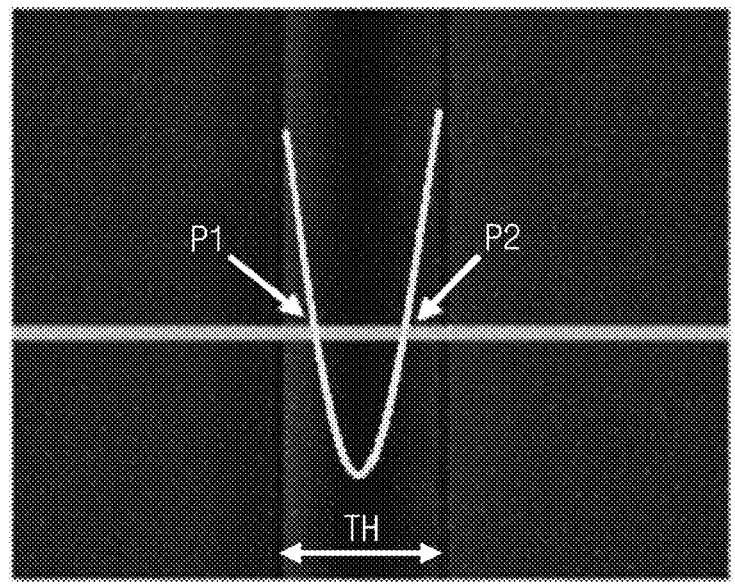
FIG. 12A and FIG. 12B are photographs illustrating an internal stress behavior of a window panel according to some example embodiments of the inventive concept.
Figure 12B:
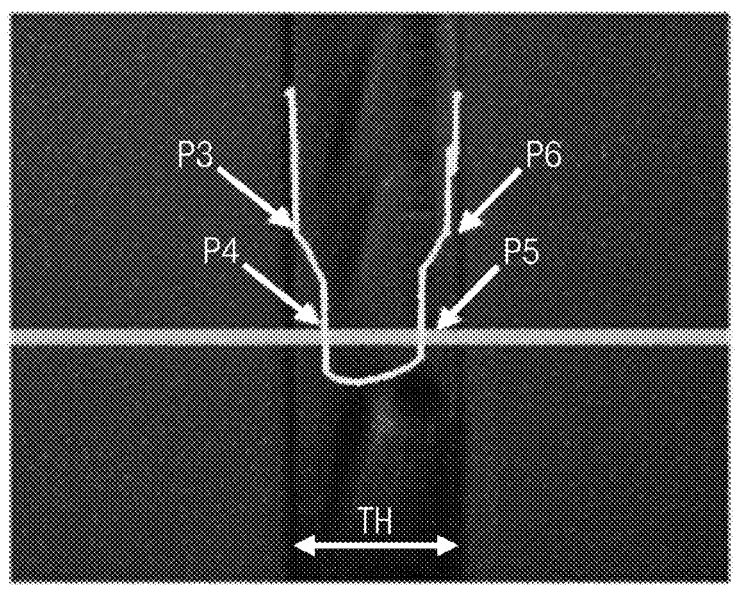

FIG. 12A and FIG. 12B are photographs illustrating an internal stress behavior of a window panel according to some example embodiments of the inventive concept. FIG. 13A to FIG. 15B are photographs of surface stress of a window panel according to some example embodiments of the inventive concept. FIG. 12A to FIG. 15B are views of a window panel subjected to a plurality of reinforcement steps. Hereinafter, aspects of some example embodiments of the inventive concept will be described in more detail with reference to FIG. 12A to FIG. 15B.

Figure 13A:
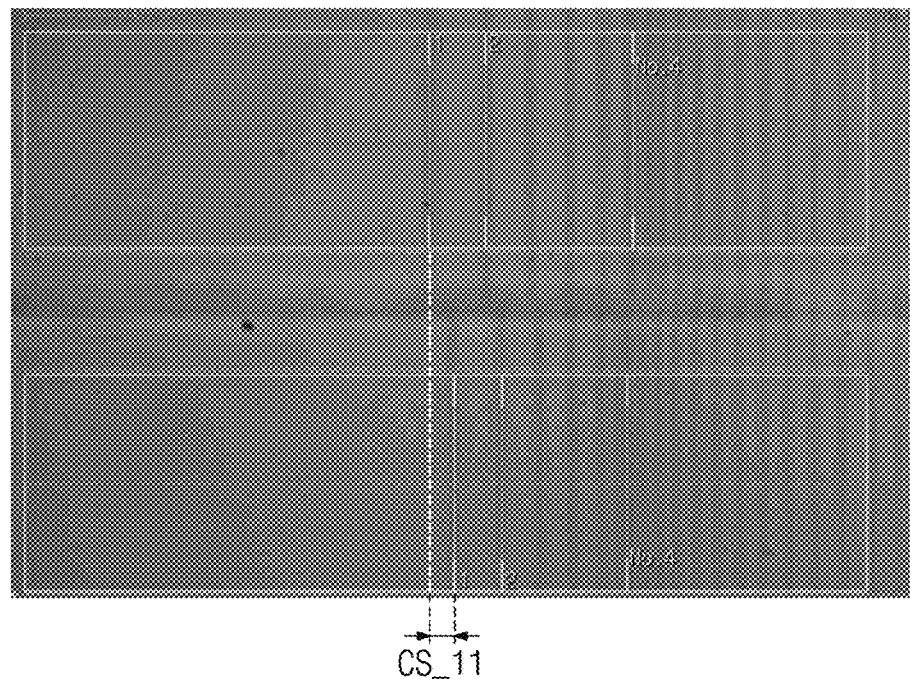
FIG. 13A to FIG. 15B are photographs of surface stress of a window panel according to some example embodiments of the inventive concept.
Figure 13B:
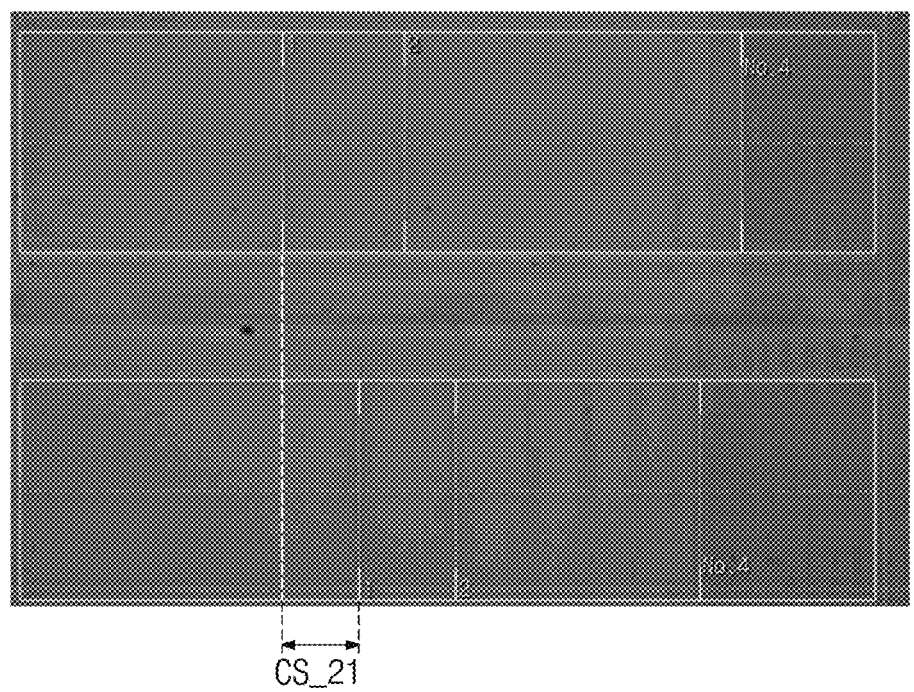
Figure 14A:
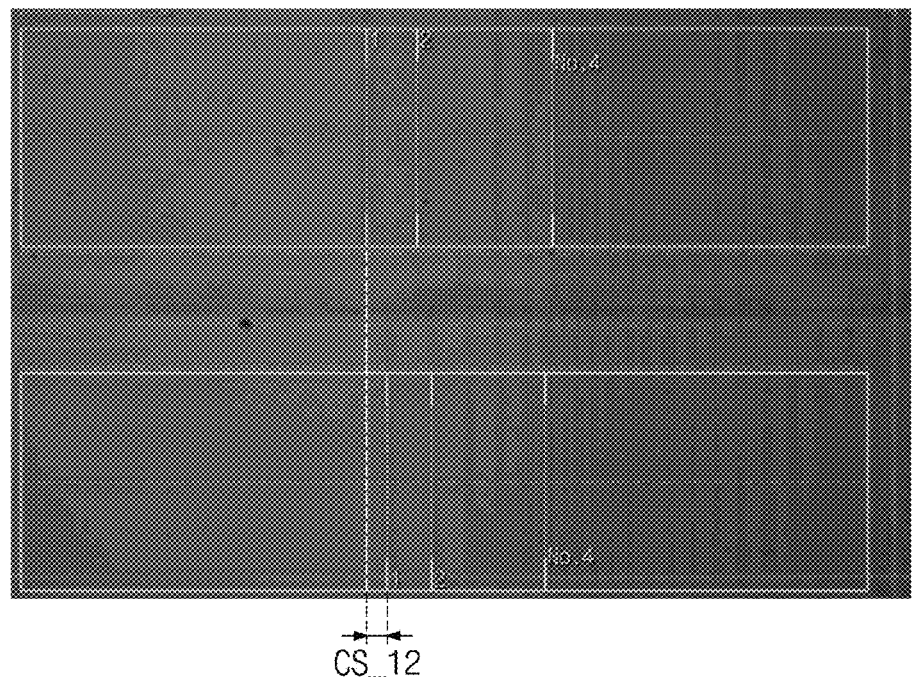
Figure 14B:
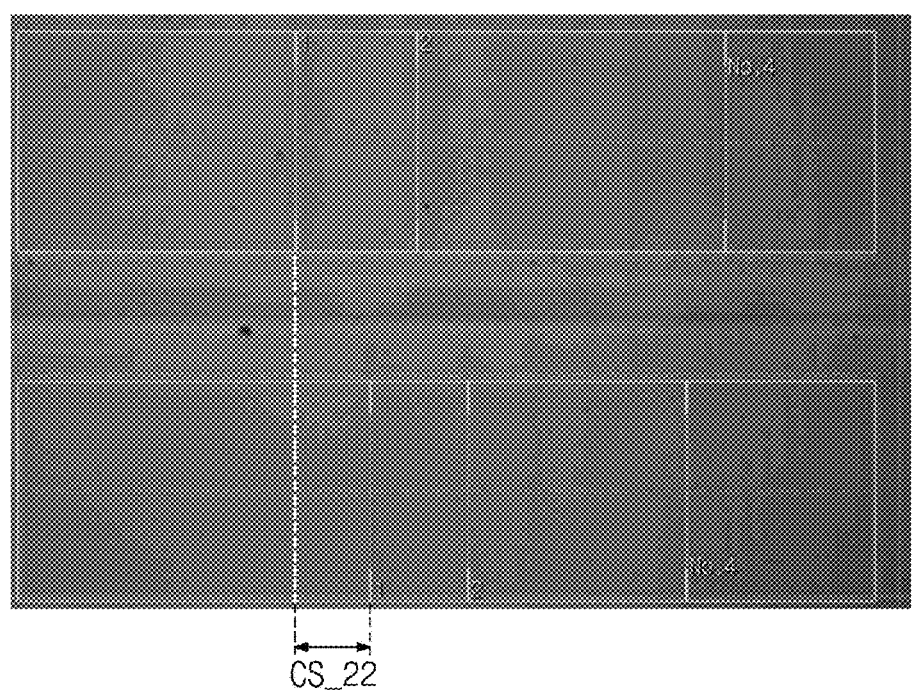
Figure 15A:
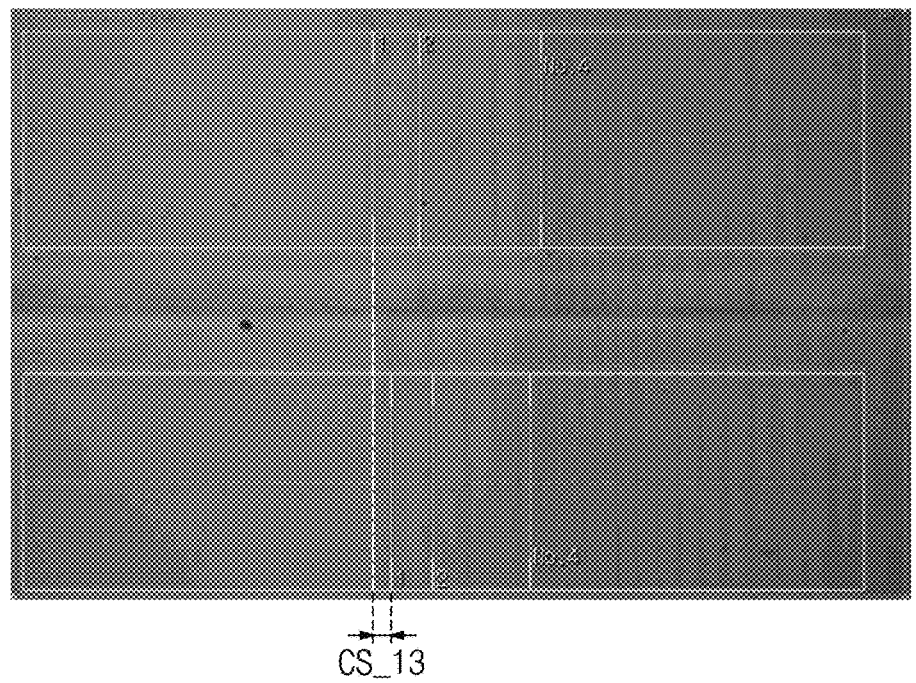
Figure 15B:
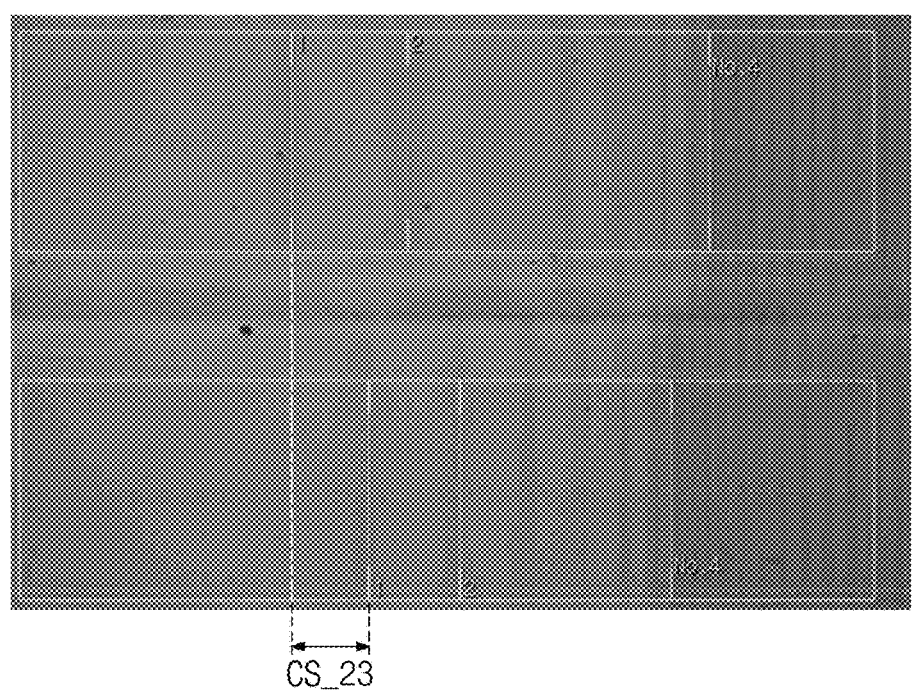

FIG. 12A illustrates an internal stress behavior of a window panel subjected to a primary reinforcement treatment, and may correspond to FIG. 7A. FIG. 12B illustrates an internal stress behavior of a window panel subjected to a secondary reinforcement treatment, and may correspond to FIG. 7B. FIG. 13A, FIG. 14A, and FIG. 15A are photographs of surface stress of window panels subjected to the primary reinforcement, and FIG. 13B, FIG. 14B, and FIG. 15B are photographs of surface stress of window panels subjected to the secondary reinforcement. FIG. 13A to FIG. 15B illustrate surface stress respectively measured by a film stress measuring device (FSM). Hereinafter, aspects of some example embodiments of the inventive concept will be described in more detail with reference to FIG. 12A to FIG. 15B. Meanwhile, the same reference numerals are given to the same components as those described with reference to FIG. 1 to FIG. 11B, and redundant descriptions thereof are omitted.

As illustrated in FIG. 12A, when primary reinforcement treatment is performed, an internal stress behavior according to the thickness TH of a window panel may be similar to that of a window panel which has been subjected to thermal reinforcement. Each of a first point P1 and a second point P2 may substantially correspond to the depth of compression DOC. Accordingly, each of the first point P1 and the second point P2 may be controlled to be in a range of 0.15 times to 0.3 times the thickness TH of the window panel.

As described above, in the case in which a plurality of reinforcement treatment steps are performed, a first reinforcement treatment may include a step of impregnating with a metal salt containing a mixed salt. According to some example embodiments, a primary reinforcement step was performed by impregnating at 420° C. for 300 minutes with a mixed salt in which sodium nitrate and potassium nitrate are mixed in a ratio of 3:7.

Thereafter, as illustrated in FIG. 12B, the window panel which has been subjected to secondary reinforcement may have an internal stress behavior in which central tensile stress is reduced and surface compressive stress is increased. The secondary reinforcement was performed by impregnating with a single salt of 100% potassium nitrate at 420° C. for 30 minutes. The environment of a secondary reinforcement step may be controlled such that the depth of layer DOL is designed to be equal to or greater than 0.2 times the thickness TH of the window panel.

Referring to FIG. 12B, the stress behavior of the window panel subjected to the secondary reinforcement step may include a section having at least two different slopes before depth of compression. For example, as described above, each of a third point P3 and a sixth point P6 may refer to the transition point TP (see FIG. 7B) transforming to a slope having different properties, and each of a fourth point P4 and a fifth point P5 may refer to the depth of compression DOC. Each of the third point P3 and the sixth point P6 may be controlled to be in a range of equal to or less than 0.2 times the thickness TH of the window panel.

Referring to FIG. 13A, the primary reinforcement step was performed by impregnating at 420° C. for 240 minutes with a mixed salt in which sodium nitrate and potassium nitrate are mixed in a ratio of 3:7. At this time, a first sample subjected to the primary reinforcement treatment has a surface compressive stress CS_11 of 272 MPa, and a depth of layer of 20.4 μm, which may be represented by 0.4 T.

Referring to FIG. 13B, the secondary reinforcement was performed by impregnating with a single salt of 100% potassium nitrate at 400° C. for 45 minutes. At this time, the first sample subjected to the secondary reinforcement treatment has a surface compressive stress CS_21 of 738 MPa, a depth of layer of 17.1 μm, which may be represented by 0.34 T, when the thickness TH of the window panel is denoted as "T." The depth of layer of the first sample subjected to the secondary reinforcement treatment was slightly reduced to about 3 μm. However, the surface compressive stress thereof was increased to 500 MPa or greater.

Referring to FIG. 14A, the primary reinforcement step was performed by impregnating at 420° C. for 300 minutes with a mixed salt in which sodium nitrate and potassium nitrate are mixed in a ratio of 3:7. At this time, a second sample subjected to the primary reinforcement treatment has a surface compressive stress CS_12 of 200 MPa, and a depth of layer of 21.4 μm, which may be represented by 0.43 T.

Referring to FIG. 14B, the secondary reinforcement was performed by impregnating with a single salt of 100% potassium nitrate at 400° C. for 45 minutes. At this time, the second sample subjected to the secondary reinforcement treatment has a surface compressive stress CS_22 of 722 MPa, and a depth of layer of 17.0 μm. The ion depth layer of the second sample subjected to the secondary reinforcement treatment was slightly reduced to about 4 μm. However, the surface compressive stress thereof was increased to 500 MPa or greater.

Referring to FIG. 15A, the primary reinforcement step was performed by impregnating at 420° C. for 360 minutes with a mixed salt in which sodium nitrate and potassium nitrate are mixed in a ratio of 3:7. At this time, a third sample subjected to the primary reinforcement treatment has a surface compressive stress CS_13 of 174 MPa, and a depth of layer of 20.4 μm.

Referring to FIG. 15B, the secondary reinforcement was performed by impregnating with a single salt of 100% potassium nitrate at 400° C. for 45 minutes. That is, in FIG. 13B, FIG. 14. B, and FIG. 15B, the secondary reinforcement step was maintained the same. At this time, the third sample subjected to the secondary reinforcement treatment has a surface compressive stress of 749 MPa, and an ion depth of compression of 17.9 μm. The ion depth layer of the third sample subjected to the secondary reinforcement treatment was slightly reduced to about 2 μm. However, the surface compressive stress thereof was increased to 500 MPa or greater.

According to some example embodiments of the inventive concept, through a plurality of reinforcement steps, a window panel may have high surface compressive stress. According to some example embodiments of the inventive concept, by securing great depth of layer in a primary reinforcement step and by securing high surface compressive stress in a secondary reinforcement step, even in a window panel with a thickness of a thin film of 100 μm or less, improved reliability may be secured.

Figure 16A:
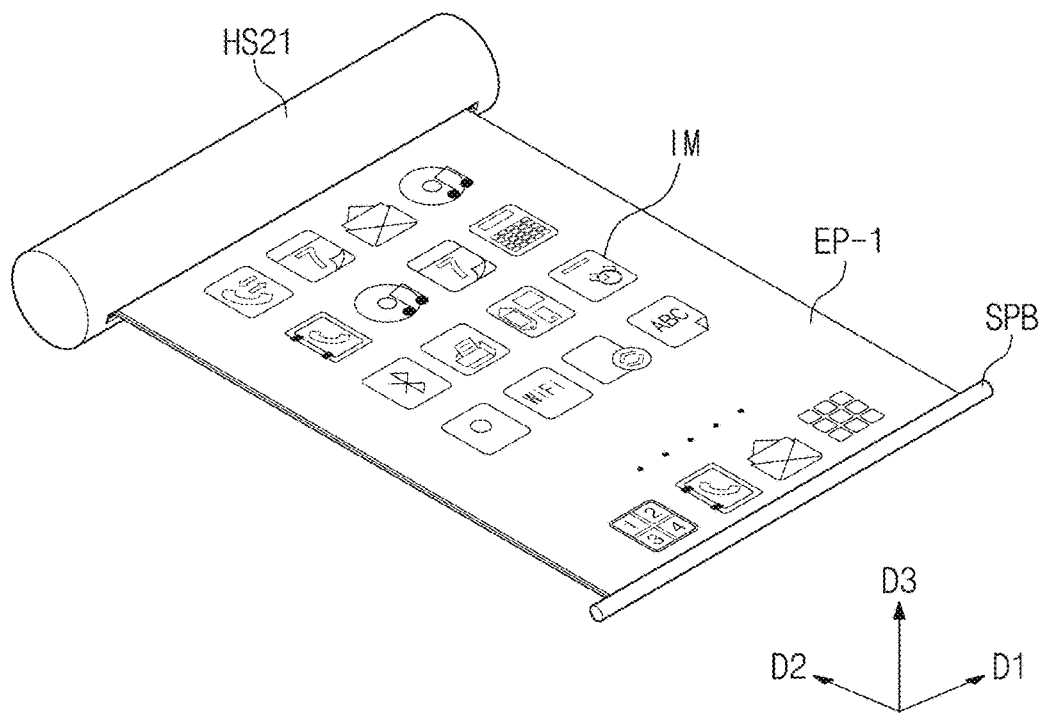
FIG. 16A and FIG. 16B are perspective views of an electronic apparatus according to some example embodiments of the inventive concept.
Figure 16B:
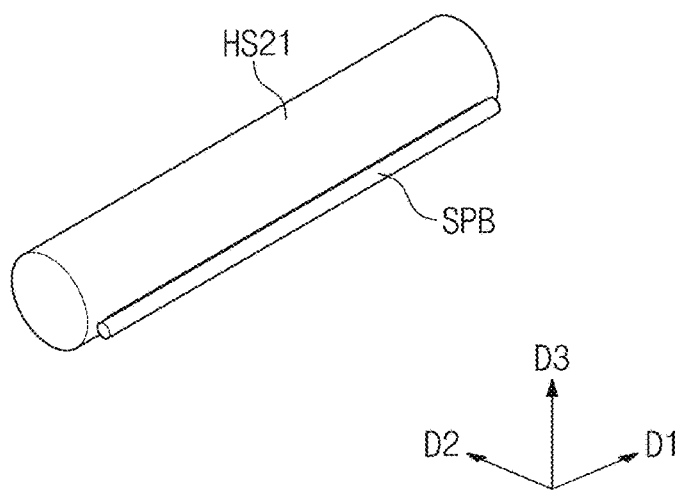
Figure 17A:
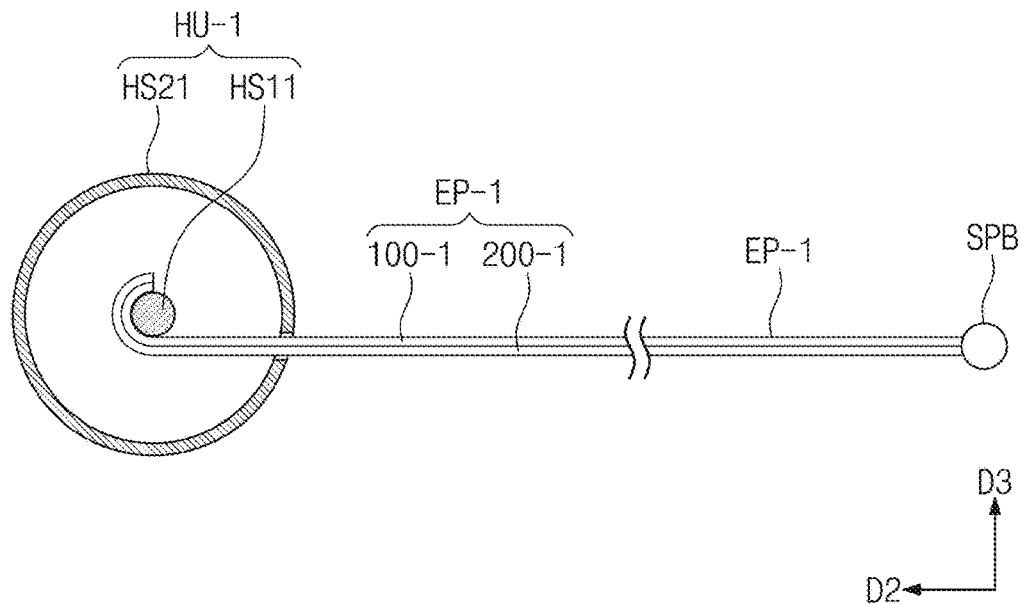
FIG. 17A and FIG. 17B are cross-sectional views of an electronic apparatus according to some example embodiments of the inventive concept.
Figure 17B:
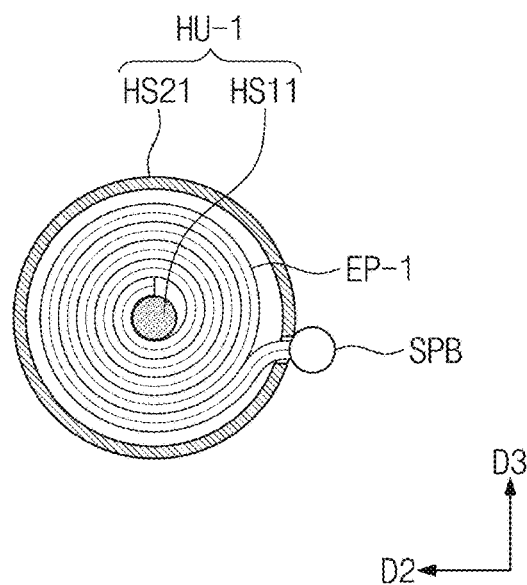

FIG. 16A and FIG. 16B are perspective views of an electronic apparatus according to some example embodiments of the inventive concept; and FIG. 17A and FIG. 17B are cross-sectional views of an electronic apparatus according to some example embodiments of the inventive concept. Hereinafter, aspects of some example embodiments of the inventive concept will be described in more detail with reference to FIG. 16A to FIG. 17B.

An electronic apparatus according to some example embodiments of the inventive concept may be a rollable electronic apparatus in a roll shape. The electronic apparatus may include a housing unit HU-1, an electronic panel EP-1, and a support part SPB.

The housing unit HU-1 may include a center member HS11 and an outer housing member HS21. The center member HS11 may be received inside the outer housing member HS21. The center member HS11 may serve as a center axis such that the electronic panel EP-1 is rolled.

The outer housing member HS21 may provide a receiving space (e.g., a predetermined receiving space). The center member HS11 may be received in the receiving space, and the electronic panel EP-1 in a rolled stated may be received in the receiving space. According to some example embodiments, the outer housing member HS21 is illustrated as being in a circular column shape with one side thereof is open. However according to some example embodiments of the inventive concept may have various shapes as long as it can provide an internal space, but is not limited to any one embodiment.

The electronic panel EP-1 displayed the image IM toward the third direction D3. The electronic panel EP-1 may include a window panel 100-I and a display panel 200-1.

The electronic panel EP-1 may be rollable. The electronic panel EP-1 may be rolled or unrolled about the center member HS11. FIG. 16A and FIG. 17A illustrate an unrolled state, and FIG. 16B and FIG. 17B illustrate a rolled state. The electronic panel EP-1 is activated in the unrolled state and displays the image IM, and is deactivated in the rolled state and is received in the housing unit HU-1.

The support part SPB may be connected to one side of the electronic panel EP-1 and supports the electronic panel EP-1. The support part SPB may maintain the shape of the electronic panel EP-1 to be parallel to a plane defined by the first direction D1 and the second direction D2 in the unrolled state, and may facilitate the entry/exit of the electronic panel EP-1 by being located outside the housing unit HU-1 in the rolled state.

According to some example embodiments of the inventive concept, because the electronic panel EP-1 includes the window panel 100-I, the window panel 100-I may be rolled/unrolled. According to some example embodiments of the inventive concept, even though the window panel 100-I is thin, improved reliability thereof may be obtained. Accordingly, in a rollable electronic apparatus, the electronic panel EP-1 having various shaped may be stably protected.

According to some example embodiments of the inventive concept, a window member with improved durability and reliability while having flexibility may be provided.

Although aspects of some example embodiments of the inventive concept have been described with reference to example embodiments of the inventive concept, it will be understood by those skilled in the art that various changes in form and details may be made therein without departing from the spirit and scope of the inventive concept.

Accordingly, the technical scope of the inventive concept is not intended to be limited to the contents set forth in the detailed description of the specification, but is intended to be defined by the appended claims, and their equivalents.

What is claimed is:

1. A window panel comprising:
a substrate having a thickness of less than 100 μm and including a first surface and a second surface facing each other in a thickness direction;
first ions dispersed in the substrate and each having a first ion radius; and
second ions dispersed in the substrate and each having a second ion radius which is greater than the first ion radius, wherein
the second ions generate a compressive stress,
the compressive stress is reduced with depth from the first surface or the second surface within a range from the first surface or the second surface to a ½ point of the thickness,
a depth of compression satisfies:

$$0.15T \leq DOC \leq 0.3T,$$

where T is the thickness of the substrate, and DOC is the depth of compression defined as a depth at which the compressive stress becomes 0 (zero),
wherein a slope of a rate of change of the compressive stress changes at a transition point between the first surface and the DOC,
a depth of layer which is defined as a maximum depth in which the second ions are spaced from the first surface or the second surface is 0.3 T or greater, and
a tensile stress increases continuously from the depth of compression to the ½ point of the thickness.

2. The window panel of claim 1, wherein the depth of layer is 0.5 T or greater.

3. The window panel of claim 2, wherein a surface compressive stress at each of the first surface and the second surface is 200 MPa or greater.

4. The window panel of claim 1, wherein a surface compressive stress is 100 MPa or greater.

5. The window panel of claim 1, wherein a surface compressive stress at each of the first surface and the second surface is 500 MPa or greater.

6. The window panel of claim 5, wherein the transition point is 0.2 T away from the first surface or less.

7. The window panel of claim 1, wherein the second ions contain alkali metal ions.

8. The window panel of claim 1, wherein the substrate is foldable about a folding axis extending along a direction intersecting the thickness direction.

9. An electronic apparatus comprising:
a display panel configured to display an image on a front surface thereof; and
a window panel on the front surface of the display panel, the window panel including a first surface and a second surface which is opposite to the first surface in a thickness direction and faces the display panel, wherein
the window panel and the display panel are foldable about a folding axis extending along a direction intersecting the thickness direction,
internal stress of the window panel has a stress behavior which varies according to a depth from each of the first surface and the second surface to a ½ point of a thickness of the window panel,
the stress behavior includes a surface compressive stress, a depth of compression, a depth of layer which is defined as a maximum depth in which second ions are spaced from the first surface or the second surface, and a center tensile stress, and the depth of compression satisfies:

0.15T≤DOC≤0.3T, where T is the thickness of the window panel, and DOC is the depth of compression defined as a depth at which a compressive stress becomes 0 (zero),
- wherein a slope of a rate of change of the compressive stress changes at a transition point between the first surface and the DOC,
- the depth of layer is 0.3 T or greater, and
- a tensile stress increases continuously from the depth of compression to the ½ point of the thickness.

10. The electronic apparatus of claim 9, wherein the stress behavior changes in a depth range not less than the depth of compression.

11. The electronic apparatus of claim 10, wherein the depth of layer is 0.5 T or greater, and the surface compressive stress at each of the first surface and the second surface is 200 MPa or greater.

12. The electronic apparatus of claim 9, wherein the surface compressive stress is 500 MPa or greater.

13. The electronic apparatus of claim 12, wherein an initial transition point at which a slope of the stress behavior changes is less than 0.2 T.

14. A method for manufacturing a window panel, comprising:
- providing an initial window panel including a first ion; and
- reinforcing the initial window panel by impregnating the initial window panel with a metal salt including a second ion having a greater radius than the first ion such that a window panel is formed, wherein
- a thickness of the window panel is less than 100 μm, and
- a depth of compression of the window panel satisfies:

0.15T≤DOC≤0.3T, where T is the thickness of the window panel, and DOC is the depth of compression defined as a depth at which a compressive stress becomes 0 (zero),
- wherein a slope of a rate of change of the compressive stress changes at a transition point between a first surface of the window panel and the DOC,
- in the reinforcing the initial window panel, a depth of layer of the second ion is designed to be 0.3 T or greater, and
- a tensile stress increases continuously from the depth of compression to a ½ point of the thickness.

15. The method of claim 14, wherein the metal salt comprises a single salt and the metal salt comprises an alkali nitrate salt, and
- in the reinforcing the initial window panel, the depth of layer of the second ion is 0.5 T or greater.

16. The method of claim 14, wherein the metal salt comprises a mixed salt and the metal salt comprises at least two different alkali nitrate salts.

17. The method of claim 14, wherein reinforcing the initial window panel further comprises:
- immersing the initial window panel in a mixed salt, and
- immersing the initial window panel in a single salt, wherein
- the depth of compression of the window panel is less than 0.2 T.

18. The method of claim 17, wherein in the immersing of the initial window panel in the mixed salt, the depth of layer of the second ion is 0.3 T or greater.

19. The method of claim 17, wherein a surface compressive stress of the window panel is 500 MPa or greater.

* * * * *